United States Patent [19]
MacLean, Jr. et al.

[11] Patent Number: 5,167,034
[45] Date of Patent: Nov. 24, 1992

[54] DATA INTEGRITY FOR COMPACTION DEVICES

[75] Inventors: Neil H. MacLean, Jr.; William F. Micka; Robert W. Miller; Mayank R. Patel, all of Tucson, Ariz.

[73] Assignee: International Business Machines Corporation, Armonk, N.Y.

[21] Appl. No.: 615,680

[22] Filed: Nov. 19, 1990

Related U.S. Application Data

[63] Continuation of Ser. No. 539,258, Jun. 18, 1990, abandoned.

[51] Int. Cl.⁵ .............................................. G06F 7/32
[52] U.S. Cl. ............................ 395/575; 364/DIG. 2; 364/951.3; 364/947.2; 364/942.7; 364/942.8; 341/60; 371/24
[58] Field of Search ... 364/200 MS File, 900 MS File; 395/575; 371/21.2, 24; 341/60

[56] References Cited

U.S. PATENT DOCUMENTS

| | | |
|---|---|---|
| 4,125,881 | 11/1978 | Eige et al. |
| 4,574,351 | 3/1986 | Dang et al. ............... 364/DIG. 1 |
| 4,899,147 | 2/1990 | Schiavo et al. ............ 364/DIG. 1 |
| 5,036,457 | 7/1991 | Glaser et al. ............. 364/DIG. 1 |
| 5,101,409 | 3/1992 | Hack ........................ 371/21.3 |
| 5,109,226 | 4/1992 | MacLean, Jr. et al. ..... 364/DIG. 1 |

Primary Examiner—Thomas M. Heckler
Attorney, Agent, or Firm—James A. Pershon

[57] ABSTRACT

A plurality of parallel compression/decompression units can be tied together to sequentially process equal amounts or sets of data from a stream of data. Hardware in the upper level of each device acts as a demultiplexer to control the acceptance of only its set of data to transfer control to permit the next device to accept data and also stores its set for compaction. Essentially identical hardware in the lower half of each device acts as a multiplexer to control the acceptance of its compacted set of data to store the compacted set and to place the compacted set into the original sequence of the stream of data for storage on the tape media. A data integrity system provides a Cyclic Redundancy Check on the data before and after each section of the process. The compacted data is decompacted immediately after compaction as a read back check to verify that the compacted data can be reconstructed when retrieved. CRC codes are stored on the media with the compacted data and are used to verify the compacted data retrieved from the media.

53 Claims, 6 Drawing Sheets

DATA INTEGRITY FOR COMPACTION DEVICES

This is a continuation of application Ser. No. 07/539,258, filed on Jun. 18, 1990, now abandoned.

CROSS REFERENCE TO RELATED INVENTIONS

A related copending patent application is Ser. No. 07/441,127 filed on Nov. 11, 1989, entitled "Control and Sequencing of Multiple Parallel Processing Devices", N. H. MacLean, et al., abandoned.

FIELD OF THE INVENTION

The present invention relates generally to digital processing devices, and in particular, to error detection systems for maintaining data integrity in the supervisory control of the subsystems.

BACKGROUND OF THE INVENTION

Information processing systems, which handle ever increasing amounts of data, require processing devices that have the ability to compact and decompact data while maintaining data integrity. Further, the control and sequencing of the processing generally requires extensive hardware to insure that the maximum efficiency is obtained in the distribution of the data to each processing device.

It is, therefore, an object of the present invention to provide a simplified hardware for the data integrity control of the splitting and merging of a data stream through multiple parallel processing units.

Formerly, data integrity was maintained in data compression systems through the use of redundant devices. The outputs of each would be compared and, if different another pass would be made through the circuitry. This was inefficient and even though the results of both encoders were compared, there was no assurance that the compacted data could be decoded and retrieved.

Another method of maintaining data integrity is to provide a byte-by-byte comparison of the original data to the decompacted data from the decoder after a retrieve cycle. But this procedure requires waiting until after the data is retrieved before the error is uncovered and much too late to reconstruct the data. The integrity of the data is known, but recovery from the error becomes from difficult to impossible.

It is, therefore, another object of the present invention to provide a data integrity control for compacted data.

Yet another object of the present invention is to provide a data integrity control for compacted data that knows that the compacted data can be decompacted when required.

SUMMARY OF THE INVENTION

In accordance with the present invention, event counters are used in each processing device for the input and output interfaces to control and verify the splitting and the merging of the respective data streams. An incoming serial data stream is divided into a plurality of sets of data of a size to fit into a buffer unit of each processing device. Each processing device receives the set and then processes the set while the next processing device in line receives the next set of data. The processed sets of data are stored into another buffer in each processing unit and the output of this buffer is sent to the output interface in the same order that the data stream was received thus maintaining the original sequence.

Initially, the first processing device has control of the interface and activates the signal identifying that it is receiving data from the data stream. The signal is active until the first processing device receives all of its data from the data stream. The first processing unit then deactivates its output signal and the next processing device in turn will take control of the interface and activates its signal until it has received all of the second set of data from the data stream. At that time the second processing device deactivates its output and the next processing device, in turn, continues to receive its set of data. The sequence continues from the last processing device to the first processing devices until all the sets of data from the data stream have been received and processed.

Each processing device has two interface event counters to count the number of sets of data transferred on each interface, input and output. Each processing device can thereby calculate when it should take control of the interface and verify that the previous processing device has relinquished control. Further, the processing device downstream of the processing device taking control to receive data can verify that the upstream processing device indeed has taken control. The transfer of the control of the interface occurs at set data boundaries. Each time an end of set is detected or, if the sets are of the fixed size, that is, when that amount of data has been received, the control of the interface is transferred from the present processing device to the next processing device downstream.

Still another object is to provide a total compression scheme that is adaptable to the data that is to be stored on media.

In the total attribute of the present invention, a control unit, through channel adaptors, accepts the requests from host central processing units to control a device such as a magnetic tape recording device. The device could also be a magnetic disk or optical recording device. Also, the device could be a plurality of recorders within the aspects of this invention.

The control of the device for media motion control is through a microprocessor and a device adaptor, and a motion control unit generally in the device. The motion control unit controls the carriage control for handling of the insertion and extraction of the media, the threading mechanism, if the media is a tape held within a cartridge, for placing the media in contact with a transducer for reading and writing onto the media. The motion control also controls the speed and tension of the tape media for correct interaction with the transducer.

The data transfer to and from the media via the transducer is through read and write circuits and formatters to a buffer control which operates under the control of the microprocessor to adapt the data useable by the host CPU into the type of data for storage onto a utilization device, the media device. The compaction and decompaction of the data by the control unit for storage and retrieval to and from the devices is through a compaction system. The data from the channel adaptor is compacted in a compaction unit and an autoblocking unit of the compaction system and then written onto the media by the transducer for storage. To retrieve the compacted data, the transducer reads the data from the media as the media is transported past the transducer under control of the motion control and the control unit. The data read by the transducer is amplified and converted, and directed through a buffer control to be decompressed by the compaction system to return the compressed data to the original state for transmission to the channel adaptors and the host CPU.

Thus, the present invention provides a compaction system for compacting and decompacting data, a means for directing data received from a host CPU to the compaction system, a device for handling a storage media, a means for controlling the motion of the storage in the device, a means for transforming the compacted data into a format for placement onto the storage media, a transducer for storing and retrieving the formatted compacted data to and from the media, means for transforming the retrieved, formatted compacted data into compacted data, means for directing the retrieved compacted data to the compaction system for decompaction, means for directing the decompacted data to the host CPU, and means, under control of the host CPU, to direct the transfer of data through the controls and the device and the placement and retrieval of the data to and from the storage media. The compaction system includes a data integrity system for ensuring that the data can be encoded and decoded with errors, if any, noted at each step through the compaction process.

For the preferred embodiment of the present invention, the block of data is divided into a plurality of sets of data of similar size for processing. Each set is directed to each of the compaction devices to compress the data. The set is also directed to a first cyclic redundancy generator for error detection. A storage control in the processing device accepts the data from the data stream and, when full, signals the compression encoder to begin processing the set. The storage control acts as a register to store the sets, as a demultiplexer to distribute the set of data to a compression encoder, and as a multiplexer to receive and reassemble the sets after decompression from the decoder.

After encoding, the compacted sets of data are reassembled in a second storage control that likewise acts as a register to store the compacted sets, as a multiplexer to reassemble the sets after compaction encoding, and as a demultiplexer to receive and separate the compacted sets of data for decompression in a decoder. The compacted sets are directed to the decoder for decompaction. The output of the decoder is directed to a second cyclic redundancy generator. The first and second cyclic redundancy generators output are compared and, if the same, the compacted data is released for storage on the media.

Each processing unit guarantees that a determinable maximum amount of time is spent on each set of data thereby ensuring that a minimum data rate is accomplished for each unit. Therefore, the data flow for the total system can be increased by adding processing units since each processing device adds a process, i.e., encoding and decoding of that set of data from the data stream.

Error detection systems, cyclic redundancy checkers (CRC), are included to provide a data integrity system that checks the data before and after each of the processes using the polynomial $X^{16}+X^{15}+X^8+X+1$. A CRC output 0 is generated on the original data by each processing device. All are compared after all of the data is received to verify that each processing device received all of the data. Each processing device generates a CRC output 1 only on the packets of data that each process. The output of the encoder generates a CRC output A and is sent to the decoder for decompaction. The output of the decoder generates a CRC output 2 that is compared to the CRC output 1 to verify that the compacted data can be decompacted correctly, as well as being encoded correctly.

The compacted data transmitted to the media utilization generates a CRC output B. The transmitted data is also received from the media utilization to generate a CRC output C. At the end of the compacted data transfer, the CRC output A is compared to the CRC output B to verify that the data has been transmitted to the media correctly. Each processing device receives all of the data transmitted to the media from all of the processing devices and each generates a CRC output D on the entire compacted data sent to the media. The CRC output 0 of all processing devices are compared at the end of the data transfer and, if verified, the CRC output 0 is stored with the compacted data on the media. The CRC output D from each processing device is compared and stored on the media. At the end of the data transfer, the CRC output B is compared to the CRC output C in each processing device to verify that each has transferred its data to the media correctly.

For the read cycle to retrieve the compacted data, each processing device receives the entire compacted data and generates CRC outputs C and D. After decompaction by the decoder, each processing device generates a CRC output 0 on the entire data. The CRC output 0 from each processor is compared to each other and to the CRC output 0 signal stored on the media to verify that the data was correctly retrieved. The CRC outputs C and D from each processing device are compared to verify that each received its data correctly from the media.

The CRC outputs 1 and 2 insure data integrity of the received and compacted data. The CRC outputs A and B verify the data integrity of the transmitted data to the media. The CRC outputs D and C verify the integrity of the received data from the media. The CRC output D of each processing device insures the data integrity of the transmitted data and the received data to and from the media. The CRC output 0 verifies the decompaction of the data with the original data received.

Another object of the present invention, therefore, is to provide enhanced data integrity of multiple parallel processing devices.

Yet another object is to provide for the data integrity control of compaction and decompaction processing devices such that the integrity of the long term storage of compacted data can be assured.

Still another object is to provide for the data integrity control of compacted data before long term storage that uses the same compaction hardware to assure integrity of the compacted data while also assuring that the compacted data can be later retrieved and correctly decompacted after long term storage.

The foregoing and other objects, features and advantages of the invention will be apparent from the following more particular description of the preferred embodiment of the invention, as illustrated in the accompanying drawings.

BRIEF DESCRIPTION OF THE DRAWING

The various novel features of this invention, along with the foregoing and other objects, as well as the invention itself both as to its organization and method of operation may be more fully understood from the following description of illustrated embodiments when read in conjunction with the accompanying drawing, wherein.

DETAILED DESCRIPTION

Figure 1A:
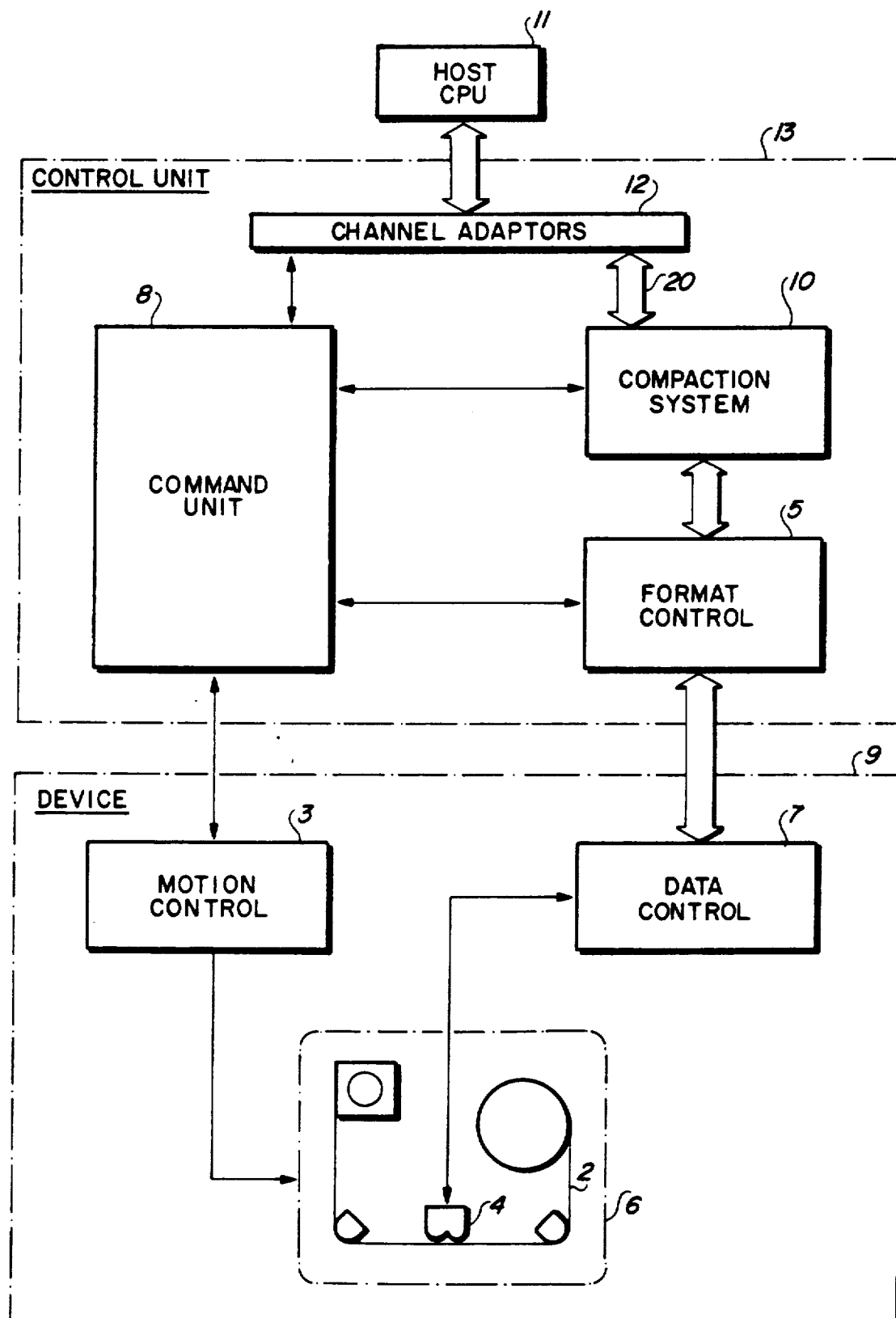
FIG. 1A is a high level flow block diagram of a data processing system of the present invention.

In general, the present invention can be used with any processing device operating in parallel on the same data stream. The present invention is preferable for use with a magnetic tape system and in particular is for use in the IBM 3490 tape subsystem. The processing devices comprise four data compaction encoders/decoders all running in parallel in order to maximize throughput and transmission bandwidth. Data is compacted (encoded) prior to being written on the tape media and decompacted (decoded) subsequent to being read from the tape media. The best mode described herein will, therefore, be for a magnetic tape system with data compaction capabilities, but it should be understood that the invention could be adapted for use in any data processing system, especially a data storage system such as a magnetic tape and disk system and optical storage system. The invention could also be adapted in any parallel data processing or digital communication system which receives and packetizes the data. The data is then processed and reemerged in its original form after processing for transmission to a utilization device.

The requirements for ever increasing throughput and transmission rates on high performance peripheral storage subsystems dictate a parallel architecture for the data compaction hardware. The present invention provides the capability to control and verify the sequencing of the input and the output data streams such that the input data stream can be split, compacted or decompacted, then remerged at a data rate equal to the number of compaction hardware units times the data rate provided by each unit. The error detection system maintains the integrity of the data through the compaction, storage on the media, retrieval from the media and decompaction.

The embodiment of the present invention utilizes four hardware processing devices as shown in FIG. 1. It should be evident that more or less processing devices could be used in parallel to accomplish the advantages of the present invention.

Referring more particularly to the drawing, the same reference numerals indicate like structural in operation in the various features of the drawing.

In general, referring to FIG. 1A, a data processing subsystem is controlled by a plurality of host central processing units (CPU) 11 to store and retrieve data that is required by the host units. The data processing subsystem includes at least one control unit 13 and at least one device. The control unit 13 accepts the commands and data from the hosts 11 via channel adaptor 12 and controls itself and the devices accordingly. The devices could be magnetic tape recording devices 9 as shown in the preferred embodiment, or magnetic disk or optical recorders.

Figure 1B:
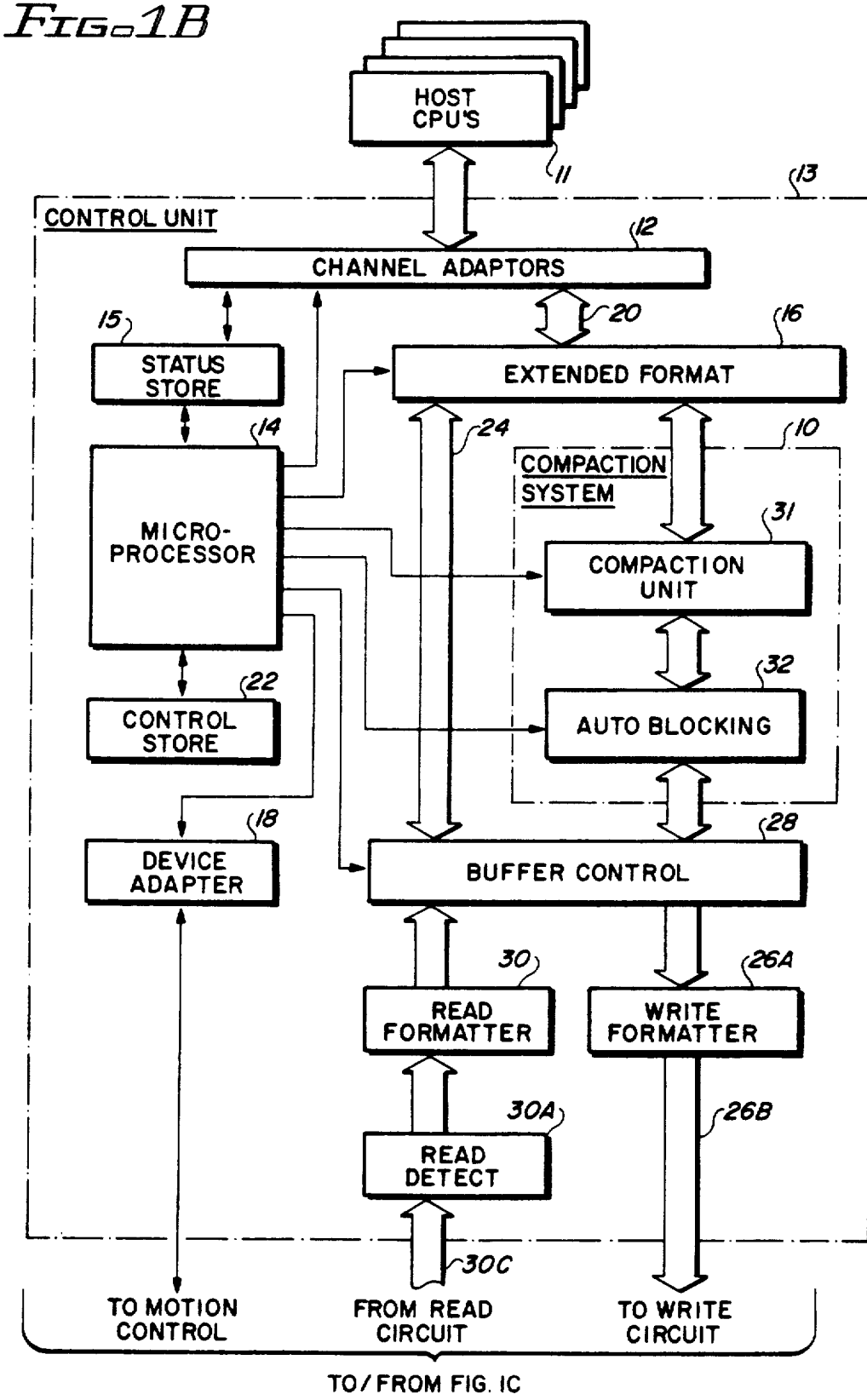
FIGS. 1B and C are a more specific flow block diagram of FIG. 1A.
Figure 1C:
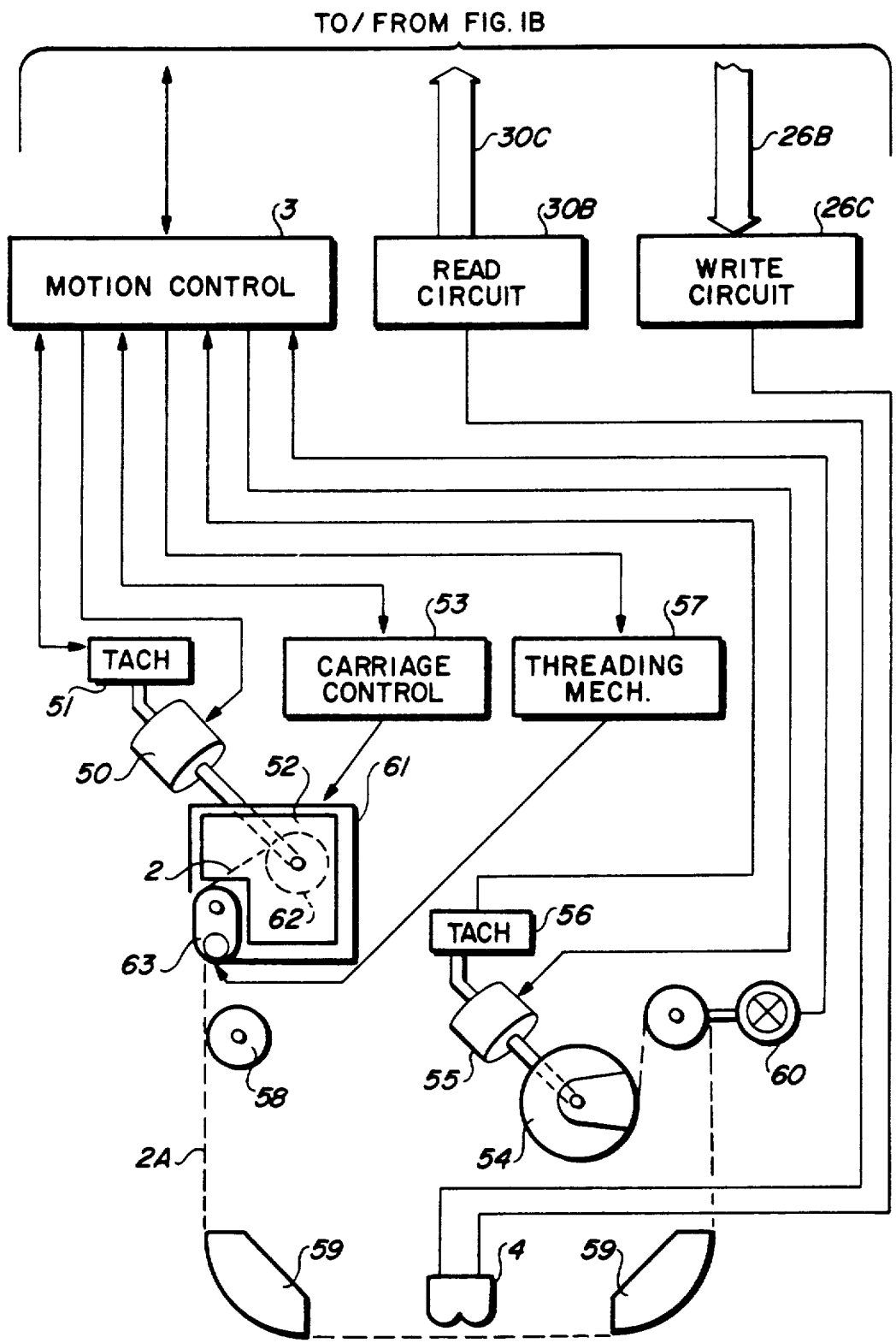
FIG. 1D is a system block diagram showing the interconnection of the plurality of processing devices, four shown, using the present invention.

The magnetic tape recording device 9 includes a means for controlling the handling of the tape media, a motion control 3, and the device mechanism in a drive 6 for transporting a tape 2 past a transducer 4 for writing and reading data to and from the tape media. Generally a data control 7 provides read and write circuits in the device 9 to operate the transducer 4. The data control 7 is connected by a cable to a format control 5 in the control unit 13. The format control 5 is shown connected by a data cable to a compaction system 10 which in turn is connected to the channel adaptor 12. The motion control 3 is controlled by a command unit 8 in the control unit 13. The command unit 8 takes the commands transmitted to the channel adaptors 12 by the hosts 11 and controls the operations of the drive 6 via the motion control 3 and the flow of data to and from the channel adaptors 12 through the format control 5 and the data control 7. A compaction system 10 is shown inserted into the data flow to compact and decompact the data for storage on the tape media 2 and retrieval from the tape media 2, respectively. FIGS. 1B and 1C show a more detailed block diagram of the data processing system of FIG. 1A. FIG. 1B shows a block diagram of the control unit 13 and FIG. 1C shows a block diagram of the device 9. The bottom of FIG. 1B is connected by cable and command lines to the top of FIG. 1C.

Referring to FIGS. 1B and 1C, the command unit 8 of FIG. 1A includes a status store 15, a microprocessor 14, a control store 22 and a device adaptor 18. An extended format 16 is essentially a part of the command unit 8 in the control of the data flow. The extended format 14 provides the capability of providing no compaction of decompaction of the data by bypassing the compaction system 10 as shown by a data cable 24. A buffer control 28 operates under control of the microprocessor 19 to store the data written on tape 2 by the write formatter 26 and the write circuit 26A of FIG. 1C to the transducer 4. The buffer control 28 also controls the data flow on a read cycle to store the data processed by a read circuit 30B from the transducer 4 and transmitted to a read detect 30A over connecting cable 30C and to a read formatter 30 to the buffer control 28. The compaction system 10 includes a compaction unit 31 and an auto blocking unit 32 as will be further discussed in FIG. 1D.

The tape recording device 9 of FIG. 1C shows the drive 6 under control of the motion control 3 to accomplish the controlled transporting of the tape 2 past the transducer 4 to accomplish the read and writing of the magnetic transition onto the tape 2 and useful in the present invention. The tape recording device 9 includes a supply reel motor 50 and a tachometer control 51, a carriage 52 and a carriage control 53, a take up reel 54 and its motor drive 55 and tachometer control 56, a threading mechanism 57, various controls of a tape path 2A such as idler 58, compliant tape guides 59 and a tape tension control 60. The tape media 2 of this preferred embodiment is contained in a cartridge 61 shown placed into the carriage 52. The cartridge 61, besides the tape 2, includes a supply reel 62 and a leader block 63, shown connected for threading by the threading mechanism 57.

Referring now more particularly to the drawing, like numbers indicate like parts and structural features in the various figures. In FIGS. 1A-C, a data processing system is shown including a magnetic tape recorder storage subsystem connected via its control unit 13 to the host system 11 including a plurality of central processing units. The magnetic tape recorder storage subsystem includes the control unit and the magnetic tape device 9. The control unit 13 provides data transfers between a plurality of devices, one indicated as being a reel-to-reel type of magnetic tape recorder 9, and the host system 11 via the plurality of channel adaptors 12. The host system 11 requests for data transfers either to or from the devices 9. All operations of the control unit 13 and the devices 9 depend upon commands and other control data received from the host system 11 through the channel adaptor 12. The total subsystem status is maintained in the control unit 13 via the status store 15. The status store 15 includes a plurality of registers containing bytes relating to device status, buffer status, channel status, and the like. Such status information reflects the selection status of the device 9, its busy status, contingent connection and all other status necessary for operating the storage subsystem with the channel adaptors 12.

The programmed microprocessor 14 operates in accordance with a microcode program stored in the control store 22. Such microprograms enable the microprocessor 14 to completely manage the buffer control 28 to provide and supervise the data flow between the channel adaptors 12 and the devices 9. The microprocessor 14 supervises and enables the selection of the channel adaptors 12. The device adaptor 18, controlled and supervised by the microprocessor 14, controls the operation of the motion control system 3. A separate device adaptor 18 controls each of the plurality of tape recorder devices 9. The microprocessor 14, using known techniques, selects the microprograms of the control store 22. Control data is supplied from the control store 22, including microprogramming instruction words. The microprocessor 14 is interrupt driven through a plurality of interrupt levels. These interrupts are supplied by the various elements of the control unit 13, the priority of which is preassigned in accordance with the functions to be performed in the control unit 13 and the tape recorder device 9.

A representation of the tape recorder device 9 is shown in FIG. 1B. Reference is made to a U.S. Pat. No. 4,125,881 to Eige, et al., for a more complete description of a control circuit useable for a reel-to-reel tape drive. Only the apparatus and procedure for an understanding of the present invention is given herein. As shown in FIG. 1B, the tape recorder device 9 includes the supply reel tachometer 51 which is connected to the supply reel motor 50. The supply reel motor 50 is driven by the motion control 3 to reversibly rotate the supply reel 62 shown located within the single reel cartridge 61. The tachometer 51 indicates to the motion control the number of rotations and the rotational position of the motor 50 and the supply reel 62 to the motion control 3. The take up reel tachometer 56 is connected to the take up reel motor 55 that is reversibly driven by the motion control 3. The motor 55 drives the take up reel 54. The tape, in the preferred embodiment the magnetic tape 2, takes a path, shown by a dotted line 2A from the supply reel 62 to the take up reel 54 past the idler bearing 55, the air bearing guides 59 and the magnetic head 4. The tape path continues around the guide of the tension arm transducer 60 to the take up reel 54.

Thus, for the discussion of FIG. 1B, the motion control unit 3, after the entry of the supply reel 62 of the cartridge 61 onto the clutch drive (not shown), activates the motor 50. The entry of the cartridge 61 into the carriage 52 activates the carriage control 53 which in turn causes the motion control unit 3 to activate the motor 50. The motion control 3 directs a threading operation by activating the threading mechanism 57 which will pull the tape through its path past idler bearing 58, air bearing guides 59, magnetic head 4, and the tension arm transducer 60 onto the take up reel 54. In the reading and/or writing of information onto the tape via the magnetic head 4, the speed of the motors 50 and 55 are controlled by the motion controls 3 through the tachometers 51 and 56, respectively. The writing of information onto the tape is accomplished through the write formatter 26A which places the data to be written into its format for placement onto the tape. The output of the write formatter 26A from the control unit 13 is directed to the write circuit 26C in the tape recorder device 9. The write circuit 26C controls the magnetic transducer 4 to accomplish the writing of the data onto the tape 2.

To retrieve or read the information that was written onto the tape 2, the read circuitry is activated. The magnetic transducer 4 will sense the magnetic transitions written onto the tape 2 and will direct its analog output to the read circuit 30B. The read circuit 30B amplifies the analog signals received from the magnetic transducer 4 and directs its output to the read detect 30A in the control unit 13. The read detect 30A circuitry converts the analog signal to the digital signal required for the control unit 13. The output of the read detect 30A is directed to the read formatter 30 to direct the digital read information for storage in the buffer control 28.

The actual control of the operation of read tape recorder device 9 as shown in FIG. 1B is accomplished through the microprocessor 14 in the control unit 13. The device adaptor 18 includes tag control lines and bus data transfer lines which enables the control unit 13 to closely control and operate the tape recorder device 9 through the motion control 3.

The microprocessor 14 controls the buffer control 28 to accomplish the reading and writing of the data to and from the tape and also through the device adaptor 18 and the motion control 3 controls the transport of the tape over the magnetic transducer 4 to accomplish the actual reading and writing of the data itself.

Referring to FIG. 1A, the compaction system (CS) 10 is inserted into the standard read and write flow of the control unit 13 that interconnects the plurality of channel adaptors (CA) 12, to interface with the recording media 2. The CS10 uses a CA command set, extended format 16, see FIG. 1B, to direct data transfers through the CA interfaces. When the extended format command is off, that is, when the standard format is selected, the CS10 is bypassed. The standard read and write data paths control the data transfer. When the extended format is selected. The CS10. The CS10 controls the status, transfer of data, and error function of the compaction process. The CS10 includes the compaction unit 31, and the autoblocking unit 31. The buffer control 28 is logically not part of the compaction system 10 but physically is part of the total microcode package.

The compaction unit 31, when the extended format is selected, compacts data during the channel write operation and decompacts data during the channel read operation. Data compaction is performed by using a modified version of the binary arithmetic compaction (BAC) program, explained in the article: An Introduction To Arithmetic Coding, by Glen G. Langdon, Jr., IBM Journal of Research and Development, Volume 28, Number 2, March 1984.

Figure 1D:
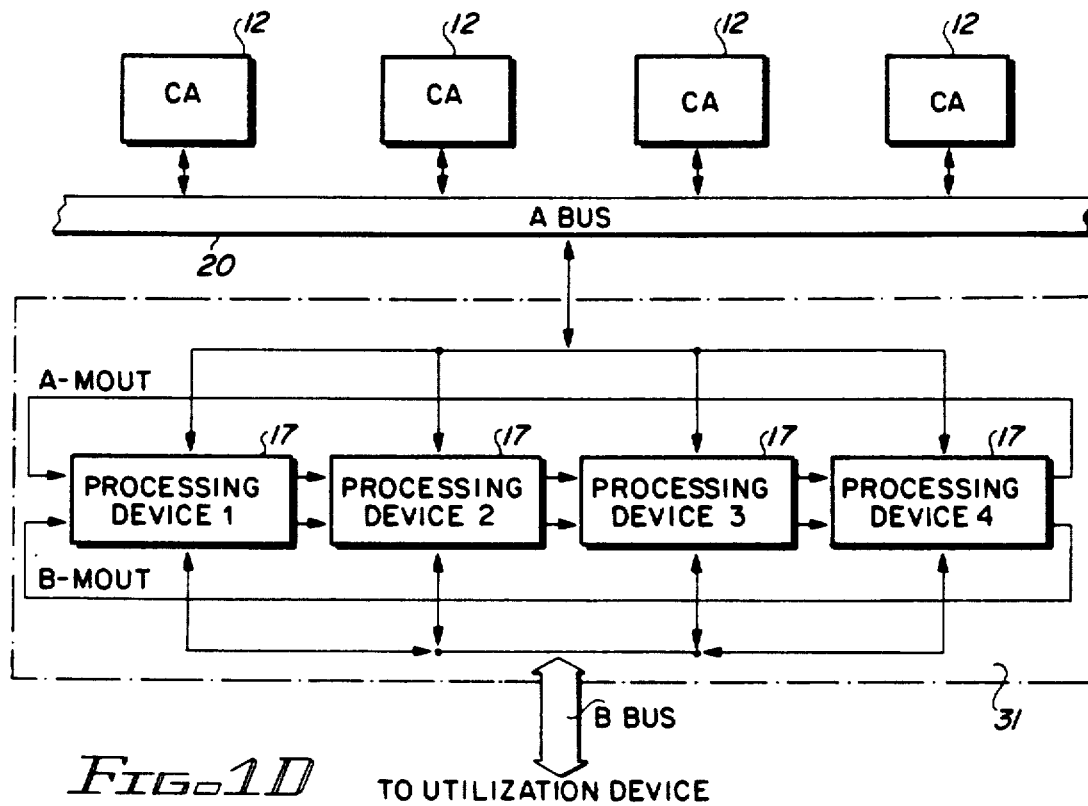

Referring now especially to FIG. 1D, the control unit 13 includes a plurality of processing devices (PD) 17, which are inserted into the standard read and write flow that interconnects the plurality of channel adapters (CA) 12, to interface with a utilization device, for this instance the write and read format control 5 to and from the recording media 2 of the device 9. The data stream from host central processing unit is directed to one of the plurality of channel adapters 12, to interface with the four parallel processing devices 17. The CA command set, extended format, directs the data stream transfer from the CA 12 interfaces to an A-bus 20, to the plurality of parallel processing devices 17. The data stream from the channel adaptors 12 is directed to all of the processing devices 17 of the compaction unit 31, and it is an A-mout signal that controls the receipt and distribution of the data to and from the processing devices. That will be discussed in more detail later. The processing devices 17 receive the unformatted data from one CA 12, and separates the unformatted data into identical size blocks or sets of data from the data stream. The individual sets of data are then directed to individual processing devices, PD 1-4, for processing of each set in turn by the plurality of processing devices 17. The processed sets of data are then reassembled into their original sequence and transmitted to the autoblocking unit 32, see FIG. 1B via a bus for use by the utilization device. The utilization device the device 9, according to the present invention, can be a third storage device and includes media such as a magnetic tape or disk or an optical store used in a stack and/or in a cartridge. The IBM 3490 tape drive is the best mode contemplated to use the present invention. This drive uses a magnetic tape stored in a cartridge. A more diagrammatic flow diagram of two processing devices and the interconnection of each is shown in FIG. 2.

Figure 2:
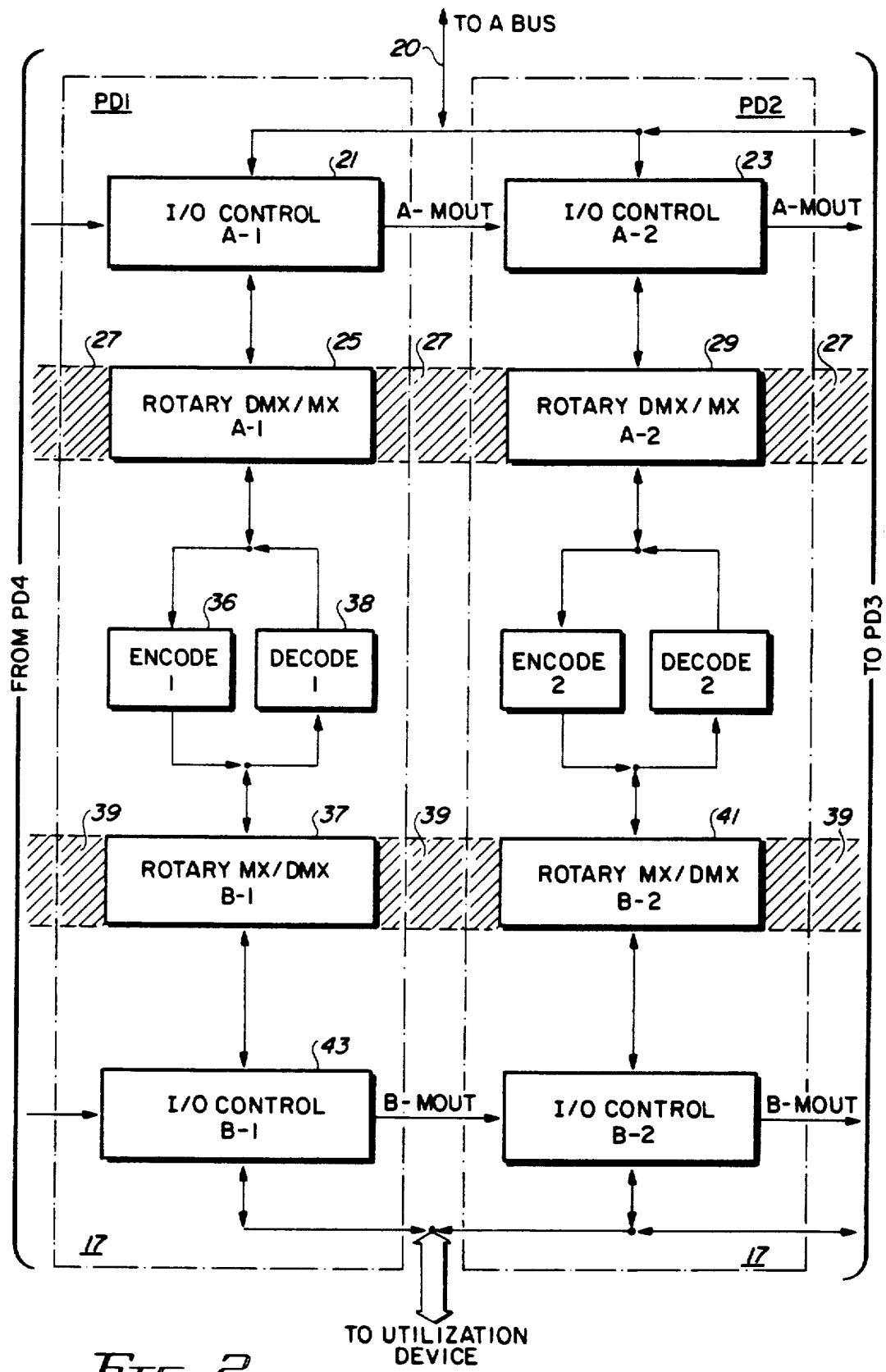
FIG. 2 is a diagrammatic representation of two processing devices of FIG. 1D.

Referring to FIG. 2, the data stream from the channel adaptors 12 is directed onto the A-bus 20, into an input output control 21 and 23, for each of the processing devices PD 1 and PD 2, I/O control A-1 and I/O control A-2. The I/O control A-1, for instance, determines the set of data that is to be directed to processing device PD 1. The A-mout signal determines which I/O control is active at any particular period of time. Processing device PD 1 for instance, also includes a section of a rotary demultiplexor/multiplexor 25, shown as DMX/MXA-1. Sets of dashed and slashed lines 27, connecting the rotary demultiplexer/multiplexer 25, DMX/MX A-1, and a rotary demultiplexer/multiplexer 29, DMX/MX A-2, of processing device PD 2, for instance, shows that the hardware of all of the processing devices 17, are interconnected in order to form one rotary demultiplexer and multiplexer unit that effectively controls the transfer of one set of data into each of the processing units 17. For the preferred embodiment, the processing devices 17 comprise the compaction system 31 and therefore processing device PD 1 also includes an encode unit 56, and a decode unit 38. The output of the encode 36 and the input to the decode 38 is a rotary multiplexer/demultiplexer 37,MX/DMX B-1, that is the resequencing hardware for the encode 36, and the separation hardware for the decode 38. Similarly for the rotary demultiplexer and multiplexer 25, above, the rotary MX-DMXB-1 is shown with hashed and dotted lines 39 marking to identify that it is a combination of hardware, including a rotary multiplexer/demultiplexer 41, from PD 2, from each of the processing devices that operate to form the second rotary multiplexer and demultiplexer function. The processing device PD 1 also includes an input/output control 43, which controls the output of the data into the utilization device and the inputting of data from the utilization device into the processing device PD 1. The processing devices PD 1-4, operating in parallel according to FIG. 1, therefore, includes an input/output control and a rotary demultiplexer and multiplexer for the top or A section of each of the processing devices and an I/O control and a rotary multiplexer and demultiplexer for the bottom or B section of the processing devices.

As shown in FIG. 2, the data stream is directed from the channel adaptors 12 to the A-bus to each I/O control of each of the processing devices. The A-mout signal directs which processing device is to get its set of data out of the data stream. The first rotary demultiplexer and multiplexer distributes the set of data to the encode and decode units within its processing device. The lower or B section of each processing device likewise includes an I/O control section and a rotary multiplexer/demultiplexer section tied in with the other hardware of each of the processing devices.

The embodiment of the present invention utilizes four compaction units, two shown in FIG. 2. During a channel write operation, the compaction unit of each processing device compacts the data received on the upper interface A from the host processor and transfers the compacted data stream on the lower interface B to its I/O control and then to the utilization device. During the channel read operation, the data string from the tape media is directed to each processing device in turn according to the delineation signals separating the compacted sets of data, and transfers the compacted data stream from the lower interface B for direction to a decode device for decompaction. The decompacted data is then transferred to the upper interface A for sequencing and transfer back to the A-bus for use by the host central processing unit.

Figure 3:
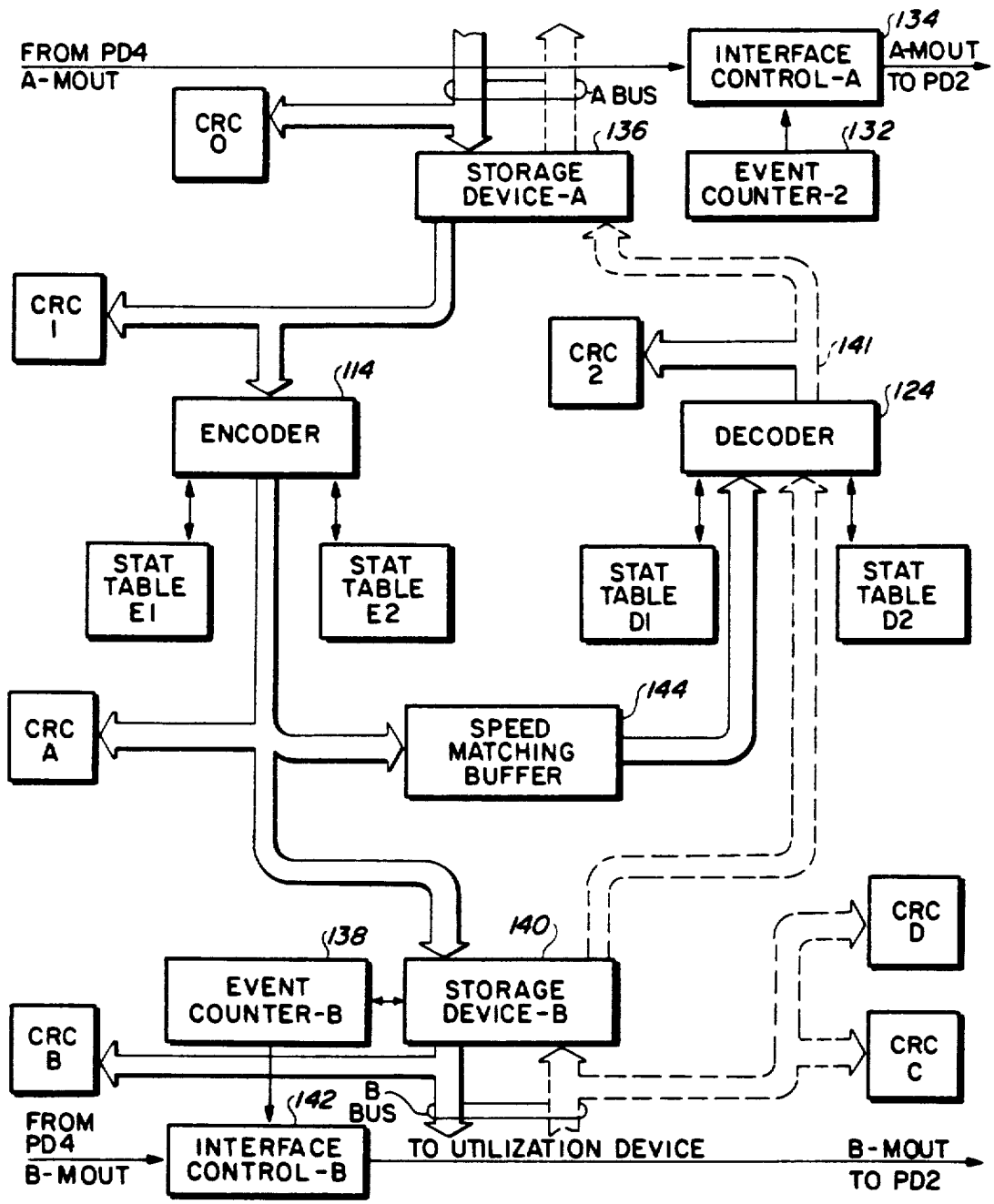
FIG. 3 is a more detailed block diagram of a processing device of FIG. 1D showing a compaction device and a data integrity system according to the preferred embodiment.

For a more detailed description of the hardware included into the processing devices for FIG. 1, reference is made to FIG. 3. As shown in FIG. 3, each processing device and in particular processing device PD 1, includes an event counter 132, an interface control 134, a storage device 136, and three cyclic redundancy generators CRC0, CRC1, and CRC2. These devices are unique to the top or A section of processing device 1. The bottom or B section of the processing device also includes an event counter 138, a storage device 140, an interface control 142, and four cyclic redundancy generators CRCA, CRCB, CRCC, and CRCD. The processing device also includes one encoder 114, one decoder 124, and a means for directed compacted data back to the decoder 124, speed matching buffer 144. The event counters A and B are used in each of the processing devices for the upper and lower interfaces to control and verify the splitting and merging of the respective data sets. Through the processing device as shown in FIG. 2, the need for separate multiplexer/- demultiplexer control hardware on each interface is eliminated.

Assuming that processing device PD 1, is activated which could be either through the initialization process or the transfer of control from the previous processing device which is processing device PD 4. The signal A-mout transfers the control from one processing device to the next. On the write operation, which is when the data stream from the host is compacted and written onto the tape media, the stream of data is first transmitted into the storage device 136 via the input portion of an A bus. Each processing device receives the entire data stream which is also directed to the CRC0 where the CRC output 0 is generated. The storage device 136 signals the event counter 132, that one set of data has been received. For this preferred embodiment, one set of data is 512 bytes. The event counter 132, in turn, signals the interface control 134 that this processing device PD 1, has received its section of data, i.e, one set, and the next set of data should be received by the processing device PD 2. On the write operation, the set of data is transmitted using the solid line bus shown in FIG. 3. The code for the different lines shown in FIG. 3 are a solid single line 146 that signifies the control lines controlling the different blocks, the solid double line 148 that signifies the write data flow (WDF). The signal transfers in the dashed dual line code 150 signifies the read data flow (RDF) signal flow through the processing device PD 1. The set of data is transmitted from the storage device 136 to the encoder 114 for compaction of the set of data. The set of data transferred to the storage device 136 is also directed to the CRC1 generator to provide the CRC output 1 code. The CRC1 generator is shown logically connected to the output of the storage device 136. In the actual embodiment, CRC1 generator is physically connected to the input of the storage device 136, together with the CRC0 generator, and controlled to accept only the set of data stored in the storage device A 136.

The encoder 114 in turn, after the compaction process is completed, transmits the compacted data set to the speed matching buffer 144 and the storage device B140. The compacted data is transmitted to the speed matching buffer 144 for storage in order to match the output of the encoder 114 with that of the decoder. The just compacted data is transmitted from the speed matching buffer 144 to the decoder 124 for decompaction. The decoder 124 in turn, transfers the decompacted data to the CRC2 connected to the output of the decoder 124 for checking. Essentially the transfer of the data from the speed matching buffer 144, to the decoder 124, and to the CRC2 on the write operation is a readback check to verify that the set of data can be encoded and decoded. The CRC output 1 from CRC1 is compared with the CRC output 2 from CRC2 and, if correct, the encoded data is ready for transfer to the storage device 140. The compacted data is transferred to the storage device 140 where it will await the control by the event counter 138 and the interface control 142 to signal that the compressed set of data can be transferred to be formatted for writing onto the tape media. A delineation signal is placed by the storage device 140, between each compressed set of data to identify each compressed set when combined from each processing device and when retrieved for decompaction. The compressed sets of data from all of the processing devices are directed to the autoblocking 32, see FIG. 1B, for further compaction and then to the buffer control 28.

The microprocessor 14 signals when the data is ready for transfer. The data is transferred to the write formatter 26A, to the write circuit 26C and the transducer 4. The drive 6 has been activated to move the tape 2 through the activation of the motion control 3 by the microprocessor 14, and the device adaptor 18 of the command unit 8. The compressed set of data from the storage device 140 is also directed to the CRCB for generation of the CRC output B. The compressed data is also received by the incoming portion of the B bus and directed to the CRCC for generation of the CRC output C signal.

The operation of cyclic redundancy generators, the generations of the codes, and the comparisons of their output is well known in the art. Reference can be made to U.S. Pat. No. 3,508,195 and many others for circuitry useable in this embodiment. The polynomial used in the generations of the CRC's in this embodiment is $X^{16}+X^{15}+X^8+X+1$. It should be evident that other polynomial and other error detection means could be used in the present invention without departing from the data integrity and readback check of the present invention.

On the read or retrieve data operation to retrieve data from the media, the compacted sets of data are received from the tape media and transmitted to the storage device 140 and to the CRCC. The channel adaptors 12 receive the read command from the host CPU11 for transfer to the status store 15. The microprocessor 14 through the control store 22 and the read command activates the motion control 3 via the device adaptor 18. The motion control 3 activates the drive 6 to transport the tape 2 past the transducer 4. The data on the tape 2 is amplified and digitized by the read circuit 30B, the read detect 30A and the read formatter 30 for transmission to the buffer control 28 and, after deblocking by the autoblocking 32, to the processing devices 17 of the compaction unit 31. The compacted bits of data information are stored within the storage device 140 until the entire compacted set of data is received. At this time the PD 1 is activated either at initialization or as activated by the B-mout signal from PD 4. The delineation signal placed between the compacted sets activates the transfer of the interface control between the processing devices which in turn activates the interface control 142 to transfer control on the B-mout signal line to the next processing device PD 2. Processing device PD 2, can receive its set of data for use within its compaction process. Using the RDF signal path, the stored compacted set of data is transferred to the decoder 124 where it is decompacted and to the CRCD for generation of the CRC output D code. The decompacted data is then transmitted to storage device 136 on line 141 for storage until the control is given to the interface control unit 134 such that the storage device 136 contains the original 512 bytes of a set of data and can transmit information onto the A-bus 20 to the channel adapters 12. The decompacted data is also directed to the CRC2 for generation of the CRC output 2 information. After the decompacted data is transferred, the event counter 132 signals the interface controller to transfer control via the A-mout signal line to the PD 2. This is done such that the next set of data can be transferred from its storage device A of the PD 2, onto the A-bus and eventually to the channel adaptor.

Essentially the storage device 136, the event counter 132, and the interface control unit 134 provides its portion of the multiplexer/demultiplexer for the upper unit of the PD 1. Similarly, the storage device 140, together with the event counter 138, and the interface control 142, perform its portion of the multiplexer/demultiplexer sequence for the lower section B of the PD 1.

The present invention describes a data integrity system that checks before and after each of the processes through the processing device, such that the input data stream can be split into data sets, compacted and/or decompacted, then merged at a data rate equal to the number of compaction hardware units times the data rate provided by each, while maintaining the data integrity throughout. During the write process, which is the transfer of data from the CPU to the media, the CRC0 of each processing device receives the entire data stream from the central processing unit and each generates the CRC output 0 on the original data of the entire data stream. At the end of the data transfer of the data stream, a cyclic redundancy check is sent to all of the processing devices, and all CRC output 0 codes are compared with the CRC output code received from the CPU to verify that the data stream was received correctly by all of the processing devices. Each processing device generates the CRC output 1 code only on the sets of data that that processing device accepts from the entire data stream.

Still referring to FIG. 3, each processing device thus compacts its set of data in the encoder 114 for instance. The output of the encoder 114 is directed to the CRCA to generate the CRC output A code. A means for directing the compacted data back to the decoder 124 includes the speed matching buffer 114. The compacted data from the encoder 114 is directed to the decoder 124 for decompaction in order to check the data which has just been compacted. The output the decoder 124 is directed to the CRC2 to generate the CRC output 2 code. At the end of the data transfer from the CPU to the media, each processing device compares its CRC output 1 code to its CRC output 2 code to verify that each processing device has compacted its respective sets of data correctly.

As transmission of the compacted sets of data to the media is occurring on the B bus, the data is directed to the CRCB for generation of the CRC output B code. The CRC output B code is generated by each processing device on all of the data that that processing device processes and transmits to the media. At the time of the transmission of the data to the media, the data is also received and directed to the CRCC for generation of the CRC output C code. At the end of the data transfer to the media, each processing device compares its CRC output A code to its CRC output B code to verify that the data has been transferred correctly to the media. As the transmission of the data to the media is occurring, each processing device receives all of the data generated by all of the processing devices and this data directed to the CRCD for generation of the CRC output D code. Each processing device clocks their respective CRC output D data with the contents of their respective CRC output 0 data. The processing device that processes the last set of data transmits its CRC output 0 signal for storage on the media after the last set of data is transferred to the media. That processing device also transmits its CRC output D signal for storage on the media after the last set of data is transmitted to the media. At the end of the data transfer, each processing devices compares its CRC output B code to its CRC output C code, to verify that its sets of data have been transferred to the media correctly. All processing devices receive the transmitted CRC output D code and compares that data to their respective CRC output D code generated by their CRCD devices. This verifies that the CRC outputs D and 0 code sent to the media by the processing device that processes the last set of data, is correct. This is essential for data integrity of both the compacted data and the data stream during a read operation, when the compacted data is decompacted and transferred back to the host CPU.

During the read process, the data is retrieved from the media and directed onto the read data flow line of the B bus to the storage device 140. Each processing device receives the entire compacted data stream from the media and generates the CRC output C and D codes. Each processing device stores its respective compacted sets of data for decompaction in the decoder 124, as previously discussed. The decoder 124, decompacts its compacted sets of data and stores the results into the storage device 136 for transmission to the host central processing unit. As transmission of the decompacted sets of data to the CPU is occurring from each of the processing devices, each processing device receives all of the decompacted data and generates the CRC output 0 code. After the last decompacted set of data is transmitted, the processing device that sent the last packet transmits its CRC output 0 code to the CPU. All of the processing devices receive the CRC output 0 code from the CPU and compare it to their respective CRC output 0 code. This verifies that the entire decompacted data was transmitted to the host CPU correctly. Then each processing device receives the CRC output D code previously stored on the media and compares it to their respective CRC output D code. This verifies the compacted data received from the media. Each processing device clocks their respective CRC output C code with the contents of their respective CRC output 0 code. Then each processing devices compares their respective CRC output D code with their CRC output C code. This operation is to verify that the entire decompacted set of data was decompacted and transferred to the host CPU correctly.

Figure 4:
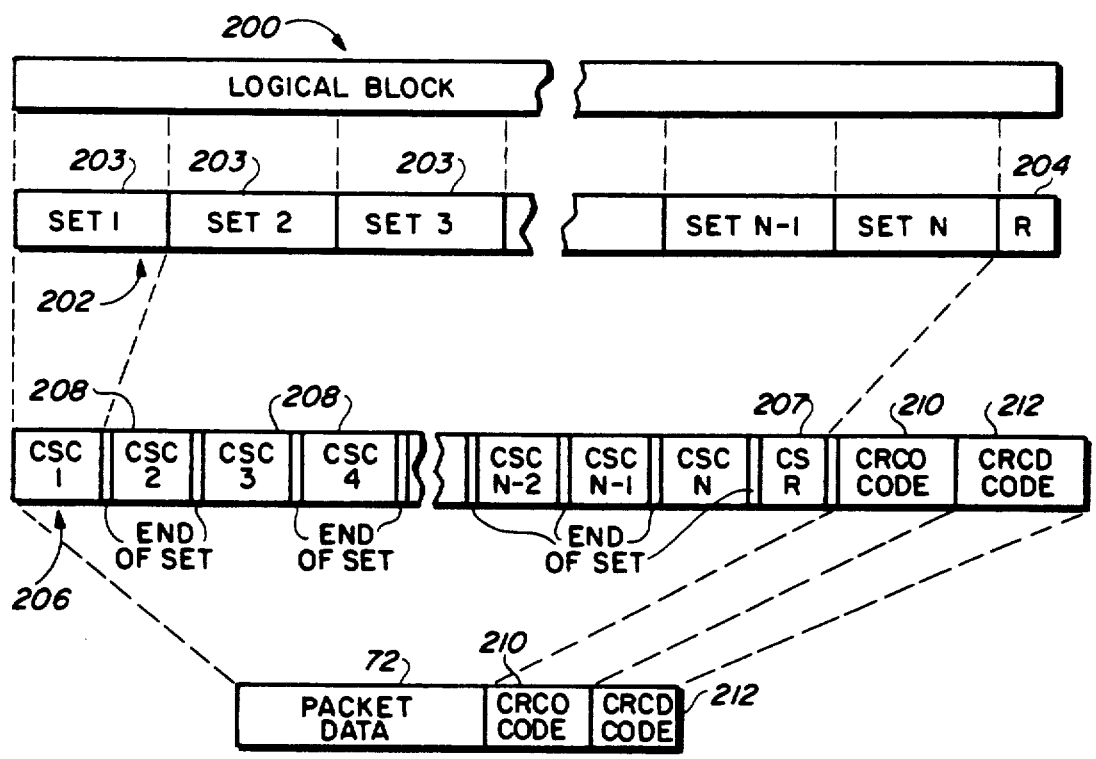
FIG. 4 is a format of the data as directed through the block diagram according to FIG. 3.

The CRC0 and the CRCD codes are placed on the media after the entire sets of compressed sets of data are written on the media, see FIG. 4. Therefore these codes are the last to be read from the media. The CRC0 code from the media is transmitted to each processing device. The CRC0 code from the media is clocked into the CRCD generators each processing device, see FIG. 3, for the first processing device. Then all of the processing devices receive the CRCD code from the media and compare it to their respective CRCD generators. This verifies that the compacted data stream was received correctly from the media. The codes of the received compacted data are compared to the codes representing that data stored with the data on the media.

The CRC1 and CRC2 generators of each processing device are necessary to ensure the data integrity of the received data stream and the compacted sets of data of each processing device. The CRCA and CRCB generators of each processing device ensures the data integrity of the transmission of the data through the storage device 140 of each processing device. The CRCB and CRCC generators verify the integrity of the compacted data to and from the media itself. The CRCD generator ensures the data integrity of the transmitted compacted data stream and the generation and transmission of the CRC output 0 and D code data for storage on the media. On the read cycle, the CRCD verifies that the compacted data is received correctly. The CRC0 is necessary on the read cycle to verify the decompaction of the compacted data stream and the correct transmission of the data stream to the host CPU during the read process.

Referring to FIG. 4, the formatting of the data stream through the control unit 13 is shown. Data from the A-bus 20 is shown as a logical block data stream 200. The logical block data store is directed to the processing device 17, i.e., storage device A136, see FIG. 3. The logical block data stream 200 is placed into equal lengths of data called sets 203 as shown in data stream 202. The identification of sets is done in the processing devices 17, as previously discussed to make each set 203 an identical length of data except for the R or remainder section 204 which contains the remaining portion of the data that was not otherwise placed into sets. These sets of data are then directed for compaction in the compaction unit 31 where they are shortened to a lesser amount of data as shown on the data storing of reference number 206. The remainder is compacted in a separate compacted character set 207 to compact only the remainder portion and to identify it as something possibly less than a complete set of data. The compacted character sets 208 are then directed for inclusion into a single packet of data 72 by the autoblocking 32 as shown in FIG. 4, for writing on the tape media 2. The end of set signals are the delineation signals separating and identifying the individual compacted sets of data 208. A CRC0 code data 210 and a CRCD code data 212, are shown attached to the data 206. The CRC0 code data 210 and the CRCD code data 212 are stored on the media together with the packet of data 72 for integrity checking of the compressed data during the read or decompression cycle as previously described.

For the present invention, it is possible for there to be any number of processing devices present. The tape subsystem determines what that number is, for the best mode of the preferred embodiment, and positions that number in a register that is located within each processing device.

For the preferred embodiment of this invention, during a channel write operation, each processing device receives a 512 byte set of data sequentially from the serial data stream received from the channel adapters 12 on the upper interface A, beginning with PD 1, followed by PD 2, then PD 3 and PD 4, and again returning to PD 1. This packetizing process of the data transfer directs the 512 byte set of data to each processing device in sequence until the entire data stream has been received from the host channel. Each processing device contains a 512 byte buffer in its A or upper section, storage device 136, for instance, for PD 1 on its upper interface to receive and hold the 512 byte set until its encoder 114 empties the storage device 136 to compact the set of data. This allows the next processing device to receive and compact their respective 512 byte set in sequence. By the time a set of data is received by PD 4, PD 1 will have compacted enough of its last set of data, having emptied a minimum of its set of data from storage device 136 to be ready to receive this next set of data, provided the transfer rate from the host channel does not exceed the combined throughput rate of the encoders within each processing device. For the preferred embodiment, the throughput rate of each encoder is 1.25 megabytes for a total combined system throughput rate of 5.0 megabytes per second.

Should the transfer rate from the host exceed the combined throughput rate of the processing device, rendering a given processing device temporarily unable to begin receiving its next set of data, that processing device will then suppress the data transfer from the channel adaptors until such time as enough of its storage device A has been emptied enabling it to resume data transfer. Each storage device A continually checks that more than 128 bytes have been emptied by the encoder subsequent to the last data written into storage device A by the host channel interface. During the time when a given storage device is receiving data from the host, should the number of available storage device A addresses shrink to 128, the processing device suppresses the data transfer from the channel. This allows room in the storage device A, to receive up to 128 data bytes from the host system without overrunning the storage device. Also, while the processing device is receiving data from the host channel, once the storage device A has been filled to a point of 128 addresses from the end of the buffer, the unit will always suppress data transfer as the current byte is received. The subsequent processing device, which is to begin receiving data 128 bytes later, will enable data transfer, nullifying the current processing device's suppression of the data, provided that greater than 128 bytes of space are available at the beginning of its storage device A buffer.

Each compaction unit stores the compacted set of data output from its encoder into a lower storage device B, which is also 512 bytes in size. The compacted sets of data from the lower buffer are transferred in sequence to the B-bus for writing on the tape media as received from the host channel prior to the data being encoded. By the time PD 4 has finished transferring a compacted set of data, PD 1 will be ready to begin transferring its next set of data on the lower interface B. This procedure of data transfer continues until the entire compacted sets of data from the data stream has been sent for writing on the tape media.

During a channel read operation, each processing device receives a compacted set of data sequentially from the serial data stream from the tape media on the lower interface B, beginning with PD 1, followed by PD 2, then PD 3 and PD 4 and again returning to PD 1. This packetizing process of data transfer continues until the entire compressed data stream has been received from the tape media. Each processing device contains the storage device B, on its lower interface B to receive and hold the compacted set while its internal decoder empties the lower storage device B, to decompact the set of data. This allows the next processing device to receive and decompact its respective compacted set of data in sequence. By the time the decompacted set is received by the PD 4, PD 1 will have decompacted enough of its last set, having emptied a minimum portion of its storage device B, to be ready to receive its next compacted set of data.

Each processing device stores the decompacted set output from its decoder into its storage device A. Storage device A, is 512 bytes in size as discussed above. The decompacted sets from the storage device A are transferred in sequence to the host channel as originally received. By the time PD 4 has finished transferring a compacted set, PD 1 should be ready to begin transferring its next set on the host channel interface, provided the transfer rate of the host channel does not exceed the combined throughput rate of the decoders within each processing device.

Should the transfer rate to the host exceed the combined throughput rate of the compaction system, rendering a given compaction unit temporarily unable to begin transferring its next set, that unit will then suppress data transfer to the channel until such time as enough of its upper buffer has been filled enabling it to resume data transfer. Each compaction unit continuously checks that data is available in its upper buffer subsequent to the last upper buffer address read from by the host channel interface. During the time when a given compaction unit is transferring data to the host, should there be no more data available in the upper buffer, the compaction unit suppresses data transfer to the channel as the last byte is transferred. Also, while a compaction unit is transferring data to the host channel, once its upper buffer has been emptied, the unit will always suppress data transfer as the last byte is transferred. The subsequent unit, which is to begin transferring the next byte of data, will enable data transfer, nullifying the current unit's suppression, provided enough of its upper buffer has been filled.

Further description of the processing of the data on a tape media system is described in the Milligan, et. al., U.S. Pat. No. 4,435,762, assigned to the assignee of the present invention.

While the invention has been particularly shown and described with reference to the preferred embodiment thereof, it will be understood by those skilled in the art that various changes in form and details may be made therein without departing from the spirit and scope of the invention.

What is claimed is:

1. An information processing system for compressing a stream of data and including a plurality of parallel and sequentially connected compression/decompression units, each of the compression/decompression units comprising:
   means for determining that a certain size section of data, one set of data, had been received by its unit;
   first storage means for storing the sets of data received;
   first signalling means controlled by said determining means for signalling the next sequentially connected unit that this unit has received its set of data and that the next unit should receive its set of data;
   an encoder connected to said first storage means for compacting each set of data received by said first storage means;
   a decoder connected to receive the compacted set of data compacted by said encoder for decompacting the compacted set of data;
   second storage means for storing the set of data compacted by said encoder;
   second signalling means for signalling that said second storage means is ready to transmit its compacted set of data;
   means in the information processing system for combining the compacted set of data stored in said second storage means for inclusion in sequence from the other compacted data from the plurality of parallel compression/decompression units;
   first error detection means connected to an input of said encoder for generating first integrity codes representative of the sets of data transmitted to said encoder;
   second error detection means connected to the output of said decoder for generating second integrity codes representative of the decompacted data from said decoder; and
   means for comparing said first and second integrity codes and for generating an error signal if said first and second integrity codes are not the same;
   whereby the data compacted by said encoder is immediately decompacted by said decoder for checking the integrity of the compacted data.

2. An information processing system as defined by claim 1, wherein each set of data compacted by each of the plurality of compression/decompression units includes 512 bytes except for a remainder byte length left over after all possible complete sets are removed from the stream of data.

3. An information processing system as defined in claim 1, wherein said compression/decompression unit is a binary arithmetic compaction processor.

4. An information processing system as defined in claim 1, wherein said first and second error detecting means uses cyclic redundancy code generators.

5. An information processing system for processing a stream of data and including a plurality of parallel and sequentially connected data processing units, each of the data processing units comprising:
   a first storage device for accepting and storing a set of data from the stream of data;
   a first event counter for counting a certain number of bytes received by said storage device to form the set of data by controlling the amount of data received by said storage device;
   a first interface control controlled by said first event counter which when reaching the count of the set of data for activating the next sequentially connected data processing unit signals that this data processing unit has received its set of data and that the next data processing unit should receive its set of data;
   an encoder connected to said first storage device for compacting the set of data from the first storage device and for adding an end of set signal;
   a decoder connected to receive the compacted sets of data compacted by said encoder for decompacting the compacted set of data;
   first error detection means connected to receive the same data directed to said encoder for generating a first integrity code representative of the sets of data transmitted to said encoder;
   second error detection means connected to an output of said decoder for generating a second integrity code representative of the decompacted data from said decoder; and
   means for comparing said first and second integrity codes and for generating an error signal if said first and second integrity codes are not the same;
   whereby the data compacted by said encoder is immediately decompacted by said decoder for checking the integrity of the compacted data;
   a second storage device for accepting and storing the compacted set of data from said encoder;
   a second event counter for determining when the entire set of data has been compacted by said encoder by sensing the end of set signal;
   a second interface control controlled by said second event counter for determining that the set of data has been compacted and for transmitting the compacted set of data from said second storage device when the second interface control is activated by said second event counter sensing the end of set signal and for signalling a subsequent data processing unit that it has transmitted its compacted set of data;

means in the information processing system for combining the compacted sets of data from each second storage device located in each of the data processing units; and third storage means connected to said combining means for receiving the compacted sets of data and storing the sets of data in the same sequence as the set sequence extracted from the stream of data.

6. An information processing system as defined in claim 5 wherein said third storage means is a media.

7. An information processing system as defined in claim 6 wherein said media is a magnetic tape stored in a cartridge.

8. An information processing system as defined in claim 5, wherein each set of data processed by each of the plurality of data processing units includes 512 bytes except for a remainder byte length left over after all possible complete sets are removed from the streams of data.

9. An information processing system as defined in claim 5, wherein said encoder and decoder compress and decompress data using a binary arithmetic compaction process.

10. An information processing system for compressing a stream of data comprising:

an encoder for compacting the stream of data to obtain a compacted stream of data;

a decoder for decompacting the compacted stream of data;

connecting means connected to an output of said encoder and an input of said decoder for directing the compacted stream of data compacted by said encoder to said decoder for decompaction;

first error detecting means connected to receive the stream of data directed to said encoder for generating a first integrity code representative of the stream of data that is compacted by said encoder;

second error detecting means connected to an output of said decoder for generating a second integrity code representative of the decompacted data from said decoder; and means for comparing said first and second integrity codes and for generating an error signal if said first and second integrity codes are not the same;

whereby the data compacted by said encoder is immediately decompacted by said decoder for checking the integrity of the compacted data.

11. An information processing system as defined in claim 10 whereby in said first and second error detecting means each includes a cyclic redundancy code generator.

12. An information processing system as defined in claim 11 wherein said cyclic redundancy code generator uses the polynomial $X^{16}+X^{15}+X^8+X+1$.

13. An information processing system as defined in claim 10 wherein said connecting means is a speed matching buffer.

14. An information processing system for processing an input stream of data from a first unit and including a plurality of parallel and sequentially connected data processing units said stream of data including a first data integrity code, each of the data processing units comprising:

first error detecting means connected to receive the stream of data distributed to all data processing units for generating a first integrity code representative of the stream of data;

a first storage device for accepting and storing a set of data from the stream of data;

a first event counter for counting a certain number of bytes received by said storage device to form the set of data by controlling the amount of data received by said storage device;

a first interface control controlled by said first event counter which when reaching the count of the set of data for activating the next sequentially connected data processing unit signals that this data processing unit has received its set of data and that the next data processing unit should receive its set of data;

an encoder connected to said first storage device for compacting the set of data from the first storage device and for adding an end of set signal;

a decoder connected to receive the compacted sets of data compacted by said encoder for decompacting the compacted set of data;

second error detection means connected to receive the set of data directed to an input of said encoder for generating a second integrity code representative of the sets of data transmitted to said encoder;

third error detection means connected to an output of said decoder for generating a third integrity code representative of the decompacted data from said decoder;

first comparing means for comparing said second and third integrity codes and for generating an error signal if no match is made;

said third error detection means further directs the data compacted by said encoder that generates said third integrity code to said decoder for immediate decompaction;

fourth error detection means connected to the output of said encoder for generating a fourth integrity code representative of the compacted data compacted by said encoder;

a second storage device for accepting and storing the compacted set of data from said encoder of said compaction system;

a second event counter for determining when the entire set of data has been compacted by said encoder by sensing the end of set signal;

a second interface control controlled by said second event counter for determining that the set of data has been compacted and for transmitting the compacted set of data from said second storage device when the second interface control is activated by said second event counter sensing the end of said signal and for signalling a subsequent data processing unit that it has transmitted its compacted set of data;

means in the information processing system for combining in sequence the compacted sets of data stored in the second storage device from each of the data processing units;

a third storage device in the information processing system connected to said combining means for receiving the compacted sets of data from all data processing units and for storing the sets of data in the same sequence as the set sequence extracted from the stream of data;

transmitting means in the information processing system and connected to said third storage means for transmitting said stored sets of data to a utilization device;

fifth error detecting means in the information processing system connected to said transmitting means for generating a fifth integrity code representative of the compacted data transmitted by said transmitting means;

sixth error detecting means connected to said transmitting means to receive all of the compacted sets of data from all data processing units for generating a first sixth integrity code representative of the compacted sets of data said sixth error detecting means also connected to accept the compacted sets of data from said third storage means after transmission by said transmitting means for generating a second sixth integrity code representative of the compacted sets of data;

second comparing means to compare the first data integrity code received with the input stream of data and the first integrity code of all processing units and for generating an error signal if not the same;

third comparing means to compare said fourth and fifth integrity codes and for generating an error signal if not the same to verify that the compacted data before and after said second storage device is the same;

fourth comparing means to compare said fifth and first sixth integrity codes and for generating an error signal if not the same to verify that the compacted data set has been transmitted to said third storage device and received correctly;

seventh error detecting means connected to receive all of the compacted data sets transmitted to said third storage means from all data processing units for generating a seventh integrity code representative of the compacted data stored in said third storage means; and fifth comparing means for comparing said seventh integrity codes from each data processing unit and for generating an error signal if no match is made to verify that the compacted data from all data processing units has been received by said third storage means.

15. The information processing system as defined in claim 14 wherein the first and seventh integrity codes are stored in said third storage device together with the compacted data.

16. The information processing system as defined in claim 15 further including:

seventh comparing means connected to receive said seventh integrity code from said third storage device and for comparing the received seventh integrity code to the seventh integrity code received by said second storage device from said third storage device, said seventh comparing means generating an error signal if no match is made.

17. The information processing system as defined in claim 14 wherein said third storage device is a media.

18. The information processing system as defined in claim 17 wherein said media is a magnetic tape media stored in a cartridge.

19. The information processing system as defined in claim 14 wherein the first through seventh error detecting means is a cyclic redundancy generator.

20. The information processing system as defined in claim 19 wherein said cyclic redundancy generator uses the polynomial $X^{16}+X^{15}+X^8+X+1$.

21. The information processing system as defined in claim 14, wherein:

said second storage device is further adapted to accept compacted sets of data from said third storage device under control of said second interface control;

said second event counter senses that said second storage device has stored that compacted set of data and the end of set signal;

said second interface control ends the transfer of data into its associated second storage device and activates the second interface control in the subsequent data processing unit when said second interface control senses that the end of set signal has been sensed by said second event counter;

said decoder decompacts the compacted set of data stored in said second storage device;

said first storage device further stores the set of data decompacted by said decoder;

said first event counter further counts the set of decompacted data and signals said first interface control that the set of decompacted data for its data processing unit has been transmitted to the first unit;

said interface control transfers the transmission control to the first interface control of the subsequent data processing unit;

whereby the decompacted sets of data from each of the first storage devices of each of the data processing units place the decompacted sets of data into the original sequence of the compacted sets of data, said sixth and seventh error detection means generate the second sixth and the seventh integrity codes on the compacted sets of data received by said second storage device, said first error detection means generate the first integrity codes on the decompacted data received by the first unit from all data processing units; and including sixth comparing means for comparing said first integrity codes from all data processing units and a second data integrity code received from the first unit as a result of the compacted data transmitted to the first unit.

22. A data processing system for compressing a stream of data from a central processing unit for storage onto a media comprising:

a control unit including adaptors for the transmission of data to and from the central processing unit under command control of the central processing unit, a command unit to process the command controls, a format control and a plurality of parallel and sequentially connected compression/decompression units; and a device including a drive for transporting the media past a transducer, a motion control under control of said command unit for controlling said drive, and a data control for activating the transducer to write data onto the media and for retrieving data from the media as the drive transports the media;

each of compression/decompression units comprising:

means for determining that a certain size section of data, one set of data, had been received by its unit;

first storage means for storing the sets of data received;

first signalling means controlled by said determining means for signalling the next sequentially connected unit that this unit has received its set of data and that the next unit should receive its set of data;

an encoder connected to said first storage means for compacting each set of data received by said first storage means;

a decoder connected to receive the compacted set of data compacted by said encoder for decompacting the compacted set of data;

second storage means for storing the set of data compacted by said encoder;

second signalling means for signalling that said second storage means is ready to transmit its compacted set of data;

means in the information processing system for transmitting the compacted set of data stored in said second storage means for inclusion in sequence with the other compacted data from the plurality of parallel compression/decompression units;

first error detection means connected to an input of said encoder for generating first integrity codes representative of the sets of data transmitted to said encoder;

second error detection means connected to the output of said decoder for generating second integrity codes representative of the decompacted data from said decoder; and means for comparing said first and second integrity codes and for generating an error signal if said first and second integrity codes are not the same;

said format control accepting the compressed sets of data and transmitting the compressed sets of data to said data control for writing the compressed data onto the media under control of said command unit; and said command unit activating said motion control to control said drive and activating said compaction system and said format control to process the write data flow from the adaptors through said compaction system, said format control and said data control to write the compressed data onto the media for storage thereon;

whereby the data compacted by said encoder is immediately decompacted by said decoder for checking the integrity of the compacted data.

23. An information processing system as defined by claim 22, wherein each set of data compacted by each of the plurality of compression/decompression units includes 512 bytes except for a remainder byte length left over after all possible complete sets are removed from the stream of data.

24. An information processing system as defined in claim 22, wherein said compression/decompression unit is a binary arithmetic compaction processor.

25. An information processing system as defined in claim 22, wherein said first and second error detecting means uses cyclic redundancy code generators.

26. A data processing system for compressing a stream of data including a first data integrity code from a central processing unit for storage comprising:

a control unit including adaptors for the transmission of data to and from the central processing unit under command control of the central processing unit, a command unit to process the command controls, a plurality of parallel and sequentially connected data processing units, and a format control;

each of the data processing units comprising:

first error detecting means connected to receive the stream of data from said adaptors and distributed to all data processing units for generating a first integrity code representative of the stream of data;

a first storage device for accepting and storing a set of data from the stream of data;

a first event counter for counting a certain number of bytes received by said storage device to form the set of data by controlling the amount of data received by said storage device;

a first interface control controlled by said first event counter which when reaching the count of the set of data for activating the next sequentially connected data processing unit signals that this data processing unit has received its set of data and that the next data processing unit should receive its set of data;

an encoder connected to said first storage device for compacting the set of data from the first storage device and for adding an end of set signal;

a decoder connected to receive the compacted sets of data compacted by said encoder for decompacting the compacted set of data;

second error detection means connected to receive the set of data directed to an input of said encoder for generating a second integrity code representative of the sets of data transmitted to said encoder;

third error detection means connected to an output of said decoder for generating a third integrity code representative of the decompacted data from said decoder;

first comparing means for comparing said second and third integrity codes and for generating an error signal if no match is made;

said third error detection means further directs the data compacted by said encoder that generates said third integrity code to said decoder for immediate decompaction;

fourth error detection means connected to the output of said encoder for generating a fourth integrity code representative of the compacted data compacted by said encoder;

a second storage device for accepting and storing the compacted set of data from said encoder of said compaction system;

a second event counter for determining when the entire set of data has been compacted by said encoder by sensing the end of set signal;

a second interface control controlled by said second event counter for determining that the set of data has been compacted and for transmitting the compacted set of data from said second storage device when the second interface control is activated by said second event counter sensing the end of set signal and for signalling a subsequent data processing unit that it has transmitted its compacted set of data;

said format control connected to said combining means and under control of said command control for preparing the compacted sets of data for storage;

a third storage device in the data processing system connected to said format control means and under control of said command control for receiving the compacted sets of data from all data processing units and for storing the sets of data in the same sequence as the set sequence extracted from the stream of data;

fifth error detecting means connected to an output of second storage device for generating a fifth integrity code;

sixth error detecting means connected to said third storage means to receive all of the compacted sets of data from all data processing units for generating a first and a second sixth integrity code representative of the compacted sets of data;

second comparing means to compare the first data integrity code received with the input stream of data and the first integrity code of all processing units and for generating an error signal if not the same;

third comparing means to compare said fourth and fifth integrity codes and for generating an error signal if not the same to verify that the compacted data before and after said second storage device is the same;

fourth comparing means to compare said fifth and first sixth integrity codes and for generating an error signal if not the same to verify that the compacted data set has been transmitted to said third storage device and received correctly;

seventh error detecting means connected to receive all of the compacted data sets transmitted to said third storage means from all data processing units for generating a seventh integrity code representative of the compacted data stored in said third storage means; and fifth comparing means for comparing said seventh integrity codes from each data processing unit and for generating an error signal if no match is made to verify that the compacted data from all data processing units has been received by said third storage means;

said command unit activating said data processing units, said format control and said third storage means to process the write data flow from the adaptors through said data processing units and said format control to write the compressed data into said third storage means.

27. The information processing system as defined in claim 26 wherein the first through seventh error detecting means is a cyclic redundancy generator.

28. The information processing system as defined in claim 27 wherein said cyclic redundancy generator uses the polynomial $X^{16}+X^{15}+X^8+X+1$.

29. The information processing system as defined in claim 28 further including:

seventh comparing means connected to receive said seventh integrity code from said third storage device and for comparing the received seventh integrity code to the seventh integrity code received by said second storage device from said third storage device, said seventh comparing means generating an error signal is no match is made.

30. The information processing system as defined in claim 26 wherein said third storage device is a media.

31. The information processing system as defined in claim 30 wherein said media is a magnetic tape media stored in a cartridge.

32. The information processing system as defined in claim 26, wherein:

said format control is further adapted to receive the compacted sets of data from said third storage means;

said second storage device is further adapted to accept compacted sets of data from said format control under control of said second interface control;

said second event counter senses that said second storage device has stored that compacted set of data and the end of set signal;

said second interface control ends the transfer of data into its associated second storage device and activates the second interface control in the subsequent data processing unit when said second interface control senses that the end of set signal has been sensed by said second event counter;

said decoder decompacts the compacted set of data stored in said second storage device;

said first storage device further stores the set of data decompacted by said decoder;

said first event counter further counts the set of decompacted data and signals said first interface control that the set of decompacted data for its data processing unit has been transmitted to the central processing unit;

said interface control transfers the transmission control to the first interface control of the subsequent data processing unit;

whereby the decompacted sets of data from each of the first storage devices of each of the data processing units place the decompacted sets of data into the original sequence of the compacted sets of data, said sixth and seventh error detection means generates the second sixth and the seventh integrity codes on the compacted sets of data received by said second storage device, said first error detection means generates the first integrity codes on the decompacted data received by the central processing unit from all data processing units; and including sixth comparing means for comparing said first integrity codes from all data processing units and a second data integrity code received from the central processing unit as a result of the compacted data transmitted to the central processing unit;

said adaptors receiving a read command from the central processing unit and said command unit responsive thereto to retrieve the compressed sets of data from said third storage means, the compressed sets of data being directed to said format control and said data processing units for decompression.

33. The information processing system as defined in claim 26 wherein the first and seventh integrity codes are stored in said third storage device together with the compacted data.

34. A data processing system for compressing a stream of data from a central processing unit comprising:

a control unit including adaptors for the transmission of data to and from the central processing unit under command control of the central processing unit, a command unit to process the command controls and a plurality of parallel and sequentially connected compression/decompression units;

each of said compression/decompression units including:

means for determining that a certain size section of data, one set of data, had been received by its unit;

first storage means for storing the sets of data received;

first signalling means controlled by said determining means for signalling the next sequentially connected unit that this unit has received its set of data and that the next unit should receive its set of data;

an encoder connected to said first storage means for compacting each set of data received by said first storage means;

a decoder connected to receive the compacted set of data compacted by said encoder for decompacting the compacted set of data;

second storage means for storing the set of data compacted by said encoder;

second signalling means for signalling that said second storage means is ready to transmit its compacted set of data;

means in the information processing system for combining the compacted set of data stored in said second storage means for inclusion in sequence from the other compacted data from the plurality of parallel compression/decompression units;

first error detection means connected to an input of said encoder for generating first integrity codes representative of the sets of data transmitted to said encoder;

second error detection means connected to the output of said decoder for generating second integrity codes representative of the decompacted data from said decoder; and means for comparing said first and second integrity codes and for generating an error signal if said first and second integrity codes are not the same;

whereby said adaptors receive a stream of data and command controls from the central processing unit and said command unit is responsive thereto to direct the stream of data to said determining means of said compression/decompression unit; and whereby the stream of data compacted by said encoder is immediately decompacted by said decoder for checking the integrity of the compacted data.

35. An information processing system as defined in claim 34, wherein said first and second error detecting means uses cyclic redundancy code generators.

36. A data processing system for compressing a stream of data from a central processing unit for storage onto a media comprising:
- a control unit including channel adaptors for the transmission of data to and from the central processing unit under command control of the central processing unit, a command unit to process the command controls, a plurality of parallel and sequentially connected data processing units and a format control, said stream of data including a first data integrity code; and
- a device including a drive for transporting the media past a transducer, a motion control under control of said command unit for controlling said drive, and a data control to activate the transducer to write data onto the media and to retrieve data from the media as the drive transports the media;

each of said data processing units including:
first error detecting means connected to receive the stream of data distributed to all data processing units for generating a first integrity code representative of the stream of data;

a first storage device for accepting and storing a set of data from the stream of data;

a first event counter for counting a certain number of bytes received by said storage device to form the set of data by controlling the amount of data received by said storage device;

a first interface control controlled by said first event counter which when reaching the count of the set of data for activating the next sequentially connected data processing unit signals that this data processing unit has received its set of data and that the next data processing unit should receive its set of data;

an encoder connected to said first storage device for compacting the set of data from the first storage device and for adding an end of set signal;

a decoder connected to receive the compacted sets of data compacted by said encoder for decompacting the compacted set of data;

second error detection means connected to receive the set of data directed to an input of said encoder for generating a second integrity code representative of the sets of data transmitted to said encoder;

third error detection means connected to an output of said decoder for generating a third integrity code representative of the decompacted data from said decoder;

first comparing means for comparing said second and third integrity codes and for generating an error signal if no match is made;

said third error detection means further directs the data compacted by said encoder that generates said third integrity code to said decoder for immediate decompaction;

fourth error detection means connected to the output of said encoder for generating a fourth integrity code representative of the compacted data compacted by said encoder;

a second storage device for accepting and storing the compacted set of data from said encoder of said compaction system;

a second event counter for determining when the entire set of data has been compacted by said encoder by sensing the end of set signal;

a second interface control controlled by said second event counter for determining that the set of data has been compacted and for transmitting the compacted set of data from said second storage device when the second interface control is activated by said second event counter sensing the end of set signal and for signalling a subsequent data processing unit that it has transmitted its compacted set of data;

means in the data processing system for combining in sequence the compacted set of data from each of the second storage device in each data processing units;

said format control receiving the compacted sets of data from said combining means and transmitting the compacted sets of data to said data control for writing the compacted sets of data onto the media under control of said command units;

fifth error detecting means connected to an output of said second storage device for generating a fifth integrity code representative of the compacted data transmitted to said format control;

sixth error detecting means connected to said combining means to receive all of the compacted sets of data from all data processing units for generating a first sixth integrity code representative of the compacted sets of data;

said sixth error detecting means also connected to accept the compacted sets of data from said media after transmission by said transmitting means for generating a second sixth integrity code representative of the compacted sets of data;

second comparing means to compare the first data integrity code received with the input stream of data and the first integrity code of all processing units and for generating an error signal if not the same;

third comparing means to compare said fourth and fifth integrity codes and for generating an error signal if not the same to verify that the compacted data before and after said second storage device is the same;

fourth comparing means to compare said fifth and first sixth integrity codes and for generating an error signal if not the same to verify that the compacted data set has been transmitted to said third storage device and received correctly;

seventh error detecting means connected to receive all of the compacted data sets transmitted to said third storage means from all data processing units for generating a seventh integrity code representative of the compacted data stored in said third storage means; and fifth comparing means for comparing said seventh integrity codes from each data processing unit and for generating an error signal if no match is made to verify that the compacted data from all data processing units has been received by the media;

said command unit activating said motion control to control said drive and activating said data processing units and said format control to process the write data flow from the adaptors through said data processing units, said format control, and said data control to write the compressed data onto the media for storage thereon.

37. The information processing system as defined in claim 36, wherein:

said channel adaptors receives a read command from the central processing unit and said command unit is responsive thereto to activate said motion control of said device to transport the media past the transducer to read the compacted sets of data from the media, the compacted sets of data being directed to said data control and said format control for processing;

said second storage device is further adapted to accept compacted sets of data from said format control under control of said second interface control;

said second event counter senses that said second storage device has stored its compacted set of data and the end of set signal;

said second interface control ends the transfer of data into its associated second storage device and activates the second interface control in the subsequent data processing unit when said second interface control senses that the end of set signal has been sensed by said second event counter;

said decoder decompacts the compacted set of data stored in said second storage device;

said first storage device further stores the set of data decompacted by said decoder;

said first event counter further counts the set of decompacted data and signals said first interface control that the set of decompacted data for its data processing unit has been transmitted to the central processing unit;

said interface control transfers the transmission control to the first interface control of the subsequent data processing unit;

whereby the decompacted sets of data from each of the first storage devices of each of the data processing units place the decompacted sets of data into the original sequence of the compacted sets of data, said sixth and seventh error detection means obtains the second sixth and the seventh integrity codes on the compacted sets of data received by said second storage device, said first error detection means obtains the first integrity codes on the decompacted data received by the central processing unit from all data processing units; and including sixth comparing means for comparing said first integrity codes from all data processing units and a second data integrity code received from the central processing unit as a result of the compacted data transmitted to the central processing unit.

38. The information processing system as defined in claim 37 wherein the first through seventh error detecting means is a cyclic redundancy generator.

39. The information processing system as defined in claim 38 wherein said cyclic redundancy generators use the polynomial $X^{16}+X^{15}+X^8+X+1$.

40. The information processing system as defined in claim 36 wherein the first and seventh integrity codes are stored on said media together with the compacted data.

41. The information processing system as defined in claim 40 further including:

seventh comparing means connected to receive said seventh integrity code from said media and for comparing the received seventh integrity code to the seventh integrity code received by said second storage device from said media, said seventh comparing means generating an error signal is no match is made.

42. The information processing system as defined in claim 36 wherein said media is a magnetic tape media stored in a cartridge.

43. A data processing system for compressing a stream of data including a first data integrity code for storage comprising:

an adaptor operational for receiving data and commands, a command unit to process the commands, a plurality of parallel and sequentially connected data processing units, and a format control;

each of the data processing units comprising:

first error detecting means connected to receive the stream of data from said adaptors and distributed to all data processing units for generating a first integrity code representative of the stream of data;

a first storage device for accepting and storing a set of data from the stream of data;

a first event counter for counting a certain number of bytes received by said storage device to form the set of data by controlling the amount of data received by said storage device;

a first interface control controlled by said first event counter which when reaching the count of the set of data for activating the next sequentially connected data processing unit signals that this data processing unit has received its set of data and that the next data processing unit should receive its set of data;

an encoder connected to said first storage device for compacting the set of data from the first storage device and for adding an end of set signal;

a decoder connected to receive the compacted sets of data compacted by said encoder for decompacting the compacted set of data;

second error detection means connected to receive the set of data directed to an input of said encoder for generating a second integrity code representative of the sets of data transmitted to said encoder;

third error detection means connected to an output of said decoder for generating a third integrity code representative of the decompacted data from said decoder;

first comparing means for comparing said second and third integrity codes and for generating an error signal if no match is made;

said third error detection means further directs the data compacted by said encoder that generates said third integrity code to said decoder for immediate decompaction;

fourth error detection means connected to the output of said encoder for generating a fourth integrity code representative of the compacted data compacted by said encoder;

a second storage device for accepting and storing the compacted set of data from said encoder of said compaction system;

a second event counter for determining when the entire set of data has been compacted by said encoder by sensing the end of set signal;

a second interface control controlled by said second event counter for determining that the set of data has been compacted and for transmitting the compacted set of data from said second storage device when the second interface control is activated by said second event counter sensing the end of set signal and for signalling a subsequent data processing unit that it has transmitted its compacted set of data;

said format control connected to said combining means and under control of said command control for preparing the compacted sets of data for storage;

a third storage device in the data processing system connected to said format control means and under control of said command control for receiving the compacted sets of data from all data processing units and for storing the sets of data in the same sequence as the set sequence extracted from the stream of data;

fifth error detecting means connected to an output of second storage device for generating a fifth integrity code;

sixth error detecting means connected to said third storage device to receive all of the compacted sets of data from all data processing units for generating a first and second sixth integrity code representative of the compacted sets of data;

second comparing means to compare the first data integrity code received with the input stream of data and the first integrity code of all processing units and for generating an error signal if not the same;

third comparing means to compare said fourth and fifth integrity codes and for generating an error signal if not the same to verify that the compacted data before and after said second storage device is the same;

fourth comparing means to compare said fifth and first sixth integrity codes and for generating an error signal if not the same to verify that the compacted data set has been transmitted to said third storage device and received correctly;

seventh error detecting means connected to receive all of the compacted data sets transmitted to said third storage means from all data processing units for generating a seventh integrity code representative of the compacted data stored in said third storage means; and fifth comparing means for comparing said seventh integrity codes from each data processing unit and for generating an error signal if no match is made to verify that the compacted data from all data processing units has been received by said third storage means;

said command unit activating said data processing units, said format control and said third storage means to process the write data flow from the adaptor through said data processing units and said format control to write the compressed data into said third storage means.

44. The information processing system as defined in claim 43, wherein:

said adaptors receiving a read command and said command unit responsive thereto to retrieve the compressed sets of data from said third storage means, the compressed sets of data being directed to said format control and said data processing units for decompression;

said format control is further adapted to receive the compacted sets of data from said third storage means;

said second storage device is further adapted to accept compacted sets of data from said format control under control of said second interface control;

said second event counter senses that said second storage device has stored that compacted set of data and the end of set signal;

said second interface control ends the transfer of data into its associated second storage device and activates the second interface control in the subsequent data processing unit when said second interface control senses that the end of set signal has been sensed by said second event counter;

said decoder decompacts the compacted set of data stored in said second storage device;

said first storage device further stores the set of data decompacted by said decoder;

said first event counter further counts the set of decompacted data and signals said first interface control that the set of decompacted data for its data processing unit has been transmitted to the central processing unit;

said interface control transfers the transmission control to the first interface control of the subsequent data processing unit;

whereby the decompacted sets of data from each of the first storage devices of each of the data processing units place the decompacted sets of data into the original sequence of the compacted sets of data, said sixth and seventh error detection means obtains the second sixth and the seventh integrity codes on the compacted sets of data received by said second storage device, said first error detection means obtains the first integrity codes; and including sixth comparing means for comparing said firth integrity codes from all data processing units and a second data integrity code received by the adaptor as a result of the data transmitted by the adaptor.

45. The information processing system as defined in claim 43 wherein the first and seventh integrity codes are stored in said third storage device together with the compacted data.

46. A data processing system for compressing a stream of data comprising:

an adaptor operational to receive data and commands, a command unit to process the commands and a plurality of parallel and sequentially connected compression/decompression units;

each of said compression/decompression units including:

means for determining that a certain size section of data, one set of data, had been received by its unit;

first storage means for storing the sets of data received;

first signalling means controlled by said determining means for signalling the next sequentially connected unit that this unit has received its set of data and that the next unit should receive its set of data;

an encoder connected to said first storage means for compacting each set of data received by said first storage means;

a decoder connected to receive the compacted set of data compacted by said encoder for decompacting the compacted set of data;

second storage means for storing the set of data compacted by said encoder;

second signalling means for signalling that said second storage means is ready to transmit its compacted set of data;

means in the data processing system for combining the compacted set of data stored in said second storage means for inclusion in sequence from the other compacted data from the plurality of parallel compression/decompression units;

first error detection means connected to an input of said encoder to obtain first integrity codes representative of the sets of data transmitted to said encoder;

second error detection means connected to the output of said decoder to obtain second integrity codes representative of the decompacted data from said decoder; and means for comparing said first and second integrity codes;

whereby said adaptor receives a stream of data and commands and said command unit is responsive thereto to direct the stream of data to said determining means of said compression/decompression unit; and whereby the stream of data compacted by said encoder is immediately decompacted by said decoder for checking the integrity of the compacted data.

47. An information processing system as defined in claim 46, wherein said first and second error detecting means uses cyclic redundancy code generators.

48. A data processing system for compressing a stream of data for storage onto a media comprising:

an adaptor operational to receive data and commands, a command unit to process the commands, a plurality of parallel and sequentially connected data processing units, and a format control, said stream of data including a first data integrity code; and a device including a drive for transporting the media past a transducer, a motion control under control of said command unit for controlling said drive, and a data control to activate the transducer to write data onto the media and to retrieve data from the media as the drive transports the media;

each of said data processing units including:

first error detecting means connected to receive the stream of data distributed to all data processing units to obtain a first integrity code representative of the stream of data;

a first storage device for accepting and storing a set of data from the stream of data;

a first event counter for counting a certain number of bytes received by said storage device to form the set of data by controlling the amount of data received by said storage device;

a first interface control controlled by said first event counter which when reaching the count of the set of data for activating the next sequentially connected data processing unit signals that this data processing unit has received its set of data and that the next processing unit should receive its set of data;

an encoder connected to said first storage device for compacting the set of data from the first storage device and for adding an end of set signal;

a decoder connected to receive the compacted sets of data compacted by said encoder for decompacting the compacted set of data;

second error detection means connected to receive the set of data directed to an input of said encoder for generating a second integrity code representative of the sets of data transmitted to said encoder;

third error detection means connected to an output of said decoder for generating a third integrity code representative of the decompacted data from said decoder;

first comparing means for comparing said second and third integrity codes and for generating an error signal if no match is made;

said third error detection means further directs the data compacted by said encode that generates said third integrity code to said decoder for immediate decompaction;

fourth error detection means connected to the output of said encoder to obtain a fourth integrity code representative of the compacted data compacted by said encoder;

a second storage device for accepting and storing the compacted set of data from said encoder of said compaction system;

a second event counter for determining when the entire set of data has been compacted by said encoder by sensing the end of set signal;

a second interface control controlled by said second event counter for determining that the set of data has been compacted and for transmitting the compacted set of data from said second storage device when the second interface control is activated by said second event counter sensing the end of said signal and for signalling a subsequent data processing unit that it has transmitted its compacted set of data;

means in the data processing system for combining in sequence the compacted set of data stored in the second storage device in each of the data processing units;

said format control receiving the compacted sets of data from said combining means and transmitting the compacted sets of data to said data control for writing the compacted sets of data onto the media under control of said command units;

fifth error detecting means connected to an output of second storage device for generating a fifth integrity code representative of the compacted data transmitted to said format control;

sixth error detecting means connected to said combining means to receive all of the compacted sets of data from all data processing units for generating a first sixth integrity code representative of the compacted sets of data;

said sixth error detecting means also connected to accept the compacted sets of data from said media after transmission by said transmitting means for generating a second sixth integrity code representative of the compacted sets of data;

second comparing means to compare the first data integrity code received with the input stream of data and the first integrity code of all processing units and for generating an error signal if not the same;

third comparing means to compare said fourth and fifth integrity codes and for generating an error signal if not the same to verify that the compacted data before and after said second storage device is the same;

fourth comparing means to compare said fifth and first sixth integrity codes and for generating an error signal if not the same to verify that the compacted data set has been transmitted to said third storage device and received correctly;

seventh error detecting means connecting to receive all of the compacted data sets transmitted to said third storage means from all data processing units for generating a seventh integrity code representative of the compacted data stored in said third storage means; and fifth comparing means for comparing said seventh integrity codes from each data processing unit and for generating an error signal if no match is made to verify that the compacted data from all data processing units has been received by the media;

said command unit activating said motion control to control said drive and activating said data processing units and said format control to process the write data flow from the adaptors through said data processing units, said format control, and said data control to write the compressed data onto the media for storage thereon.

49. The information processing system as defined in claim 48, wherein:

said adaptor receives a read command and said command unit is responsive thereto to activate said motion control of said device to transport the media past the transducer to read the compacted sets of data from the media, the compacted sets of data being directed to said data control and said format control for processing;

said second storage device is further adapted to accept compacted sets of data from said format control under control of said second interface control;

said second event counter senses that said second storage device has stored its compacted set of data and the end of set signal;

said second interface control ends the transfer of data into its associated second storage device and activates the second interface control in the subsequent data processing unit when said second interface control senses that the end of set signal has been sensed by said second event counter;

said decoder decompacts the compacted set of data stored in said second storage device;

said first storage device further stores the set of data decompacted by said decoder;

said first event counter further counts the set of decompacted data and signals said first interface control that the set of decompacted data for its data processing unit has been transmitted by the adaptor;

said interface control transfers the transmission control to the first interface control of the subsequent data processing unit;

whereby the decompacted sets of data from each of the first storage devices of each of the data processing units place the decompacted sets of data into the original sequence of the compacted sets of data, said sixth and seventh error detection means obtains the second sixth and the seventh integrity codes on the compacted sets of data received by said second storage device, said first error detection means obtains the first integrity codes on the decompacted data received by the adaptor from all data processing units; and including sixth comparing means for comparing said first integrity codes from all data processing units and a second data integrity code received by the adaptor as a result of the compacted data transmitted by the adaptor.

50. The information processing system as defined in claim 49 wherein the first through seventh error detecting means is a cyclic redundancy generator.

51. The information processing system as defined in claim 50 wherein said cyclic redundancy generators use the polynomial $X^{16}+X^{15}+X^8+X+1$.

52. The information processing system as defined in claim 48 wherein the first and seventh integrity codes are stored on said media together with the compacted data.

53. The information processing system as defined in claim 52 further including:

seventh comparing means connected to receive said seventh integrity code from said media and for comparing the received seventh integrity code to the seventh integrity code received by said second storage device from said media, said seventh comparing means generating an error signal is no match is made.

* * * * *